United States Patent
Rafferty et al.

(10) Patent No.: US 8,686,365 B2
(45) Date of Patent: Apr. 1, 2014

(54) IMAGING APPARATUS AND METHODS

(75) Inventors: Conor S. Rafferty, Newton, MA (US); Anders Ingvar Aberg, Winchester, MA (US); Tirunelveli Subramaniam Sriram, Acton, MA (US); Bryan D. Ackland, Old Bridge, NJ (US); Clifford A. King, Gloucester, MA (US)

(73) Assignee: Infrared Newco, Inc., Tucson, AZ (US)

( * ) Notice: Subject to any disclaimer, the term of this patent is extended or adjusted under 35 U.S.C. 154(b) by 1199 days.

(21) Appl. No.: 12/510,109

(22) Filed: Jul. 27, 2009

(65) Prior Publication Data
US 2010/0019154 A1    Jan. 28, 2010

Related U.S. Application Data

(60) Provisional application No. 61/084,030, filed on Jul. 28, 2008.

(51) Int. Cl.
*G01J 5/02* (2006.01)
*H01L 31/0232* (2006.01)

(52) U.S. Cl.
USPC .......................... 250/340; 257/432

(58) Field of Classification Search
USPC .......... 250/340, 339.01, 208.1; 257/E31.011, 257/E31.127, 432, 461
See application file for complete search history.

(56) References Cited

U.S. PATENT DOCUMENTS

| | | | |
|---|---|---|---|
| 3,971,065 A | 7/1976 | Bayer | |
| 4,238,760 A | 12/1980 | Carr | |
| 4,677,289 A | 6/1987 | Nozaki et al. | |
| 5,030,004 A | 7/1991 | Grant et al. | |
| 5,447,117 A | 9/1995 | Yonebara et al. | |
| 5,467,204 A | 11/1995 | Hatano et al. | |
| 5,497,269 A | 3/1996 | Gal | |
| 5,512,750 A | 4/1996 | Yanka et al. | |
| 5,965,875 A | 10/1999 | Merrill | |
| 6,864,557 B2 | 3/2005 | Turner et al. | |
| 6,897,498 B2 | 5/2005 | Gothoskar et al. | |
| 7,012,314 B2 | 3/2006 | Bude et al. | |
| 7,149,366 B1 | 12/2006 | Sun | |
| 7,218,348 B2 | 5/2007 | Misawa | |
| 7,453,129 B2 | 11/2008 | King et al. | |
| 7,608,823 B2 * | 10/2009 | Tennant .................. | 250/338.1 |
| 7,643,755 B2 | 1/2010 | Rafferty et al. | |

(Continued)

FOREIGN PATENT DOCUMENTS

WO    WO 2004/008537 A2    1/2004

OTHER PUBLICATIONS

Ackland et al., "Camera on a Chip," (Digest of Technical Papers), *IEEE Int'l Solid-State Circuits Conference, Session 1/Plenary Session/Paper TA 1.2*, pp. 22-25 and 412 (1996).
Bai et al., "Development of Hybrid CMOS Visible Focal Plan Arrays at Rockwell," Infrared Detectors and Focal Plane Arrays VI, *Proc. SPIE*, vol. 4028, pp. 174-182 (2000).
Colace et al., "A Near-Infrared Digital Camera in Polycrystalline Germanium Integrated on Silicon," *IEEE J. Quantum Electronics* 43(4):311-315 (Apr. 2007).

(Continued)

*Primary Examiner* — David Porta
*Assistant Examiner* — Faye Boosalis
(74) *Attorney, Agent, or Firm* — Wolf, Greenfield & Sacks, P.C.

(57) ABSTRACT

Optical imaging structures and methods are disclosed. One structure may be implemented as an imaging pixel having multiple photodetectors. The photodetectors may detect different wavelengths of incident radiation, and may be operated simultaneously or at separate times. An imager may include an imaging array of pixels of the type described. Methods of operating such structures are also described.

18 Claims, 14 Drawing Sheets

(56) References Cited

U.S. PATENT DOCUMENTS

| | | | |
|---|---|---|---|
| 8,063,422 B2 * | 11/2011 | Ackland et al. | 257/291 |
| 8,072,525 B1 * | 12/2011 | Ackland et al. | 348/308 |
| 2002/0039833 A1 | 4/2002 | Bensahel et al. | |
| 2003/0013218 A1 | 1/2003 | Chason | |
| 2003/0020099 A1 | 1/2003 | Taylor | |
| 2004/0052465 A1 | 3/2004 | Verbana et al. | |
| 2004/0108564 A1 | 6/2004 | Mitra | |
| 2005/0088653 A1 | 4/2005 | Coates et al. | |
| 2005/0104089 A1 | 5/2005 | Engelmann et al. | |
| 2005/0285038 A1 | 12/2005 | Frangioni | |
| 2006/0055800 A1 | 3/2006 | Ackland et al. | |
| 2009/0072284 A1 | 3/2009 | King et al. | |
| 2010/0012841 A1 | 1/2010 | Rafferty et al. | |

OTHER PUBLICATIONS

Colace et al., "Efficient High-Speed Near-Infrared Ge Photodetectors Integrated on Si Substrates," *Appl. Phys. Letters* 76(10):1231-1233 (2000).

Henker et al., "Concept of Color Correction on Multi-Channel CMOS Sensors," Digital Image Computing: Techniques and Applications, *Proc. VIIth Biennial Australian Pattern Recognition Society Conferences—DICTA*, vol. 2, pp. 771-780 (2003).

Feb. 28, 2008 International Preliminary Report on Patentability with Nov. 7, 2007 Written Opinion and May 8, 2008 International Search Report for International Patent Application No. PCT/US2006/031591.

Scribner et al., "Melding Images for Information," *SPIE OE Magazine*, 2(9):24-26 (Sep. 2002).

\* cited by examiner

IMAGING APPARATUS AND METHODS

RELATED APPLICATIONS

The present application claims the benefit of the filing date of U.S. Pat. App. Ser. No. 61/084,030, entitled IMAGING APPARATUS AND METHODS, and filed Jul. 28, 2008, by Conor Rafferty et al., which application is incorporated herein by reference in its entirety.

BACKGROUND

1. Field

The technology described herein relates to optical imaging structures and methods.

2. Related Art

Solid state image sensors, often referred to as "imagers," detect incident radiation and produce, or provide, an image based on the detected radiation. A typical imager comprises a two-dimensional array (referred to as a focal plane array, or an imaging array) of pixels each comprising a photodetector, in combination with a readout integrated circuit (ROIC). The photodetectors are sensitive to (i.e., detect) incoming radiation and produce an output signal (referred to as a "photoresponse") based on the detected radiation. The ROIC scans and quantitatively evaluates the outputs from the photodetectors, and processes them to create an image. Imagers are useful in various applications, such as professional and consumer video, still image photography, remote surveillance, astronomy, machine vision, and others.

FIG. 1A illustrates a cross-sectional view of a conventional CMOS pixel of a conventional imager. The pixel 100 includes substrate 110, an insulating layer 112, a photodetector 114, and a backend layer 116 formed on the insulating layer 112.

Conventional imager pixels each include a single detecting element, i.e., photodetector 114. As illustrated in FIGS. 1A and 1B (which is a top-down view of pixel 100 taken along the line A-A', illustrating the placement of photodetector 114 within the insulating layer 112), the photodetector 114 does not fill the entire pixel 100. Rather, the sides of the photodetector 114 are shorter than the sides of the pixel $W_P$ by an amount 2L (an amount L on either side of the photodetector 114). In some conventional CMOS pixels, the detecting element (i.e., photodetector 114) is formed in the substrate 110 itself.

BRIEF SUMMARY

According to one aspect of the invention, an apparatus comprising a plurality of pixels configured to detect radiation incident thereon is provided. The plurality of pixels comprises a first pixel comprising a first photodetector comprising germanium and configured to produce a first photoresponse indicative of a quantity of radiation incident thereon. The first pixel further comprises a second photodetector comprising silicon and configured to produce a second photoresponse indicative of a quantity of radiation incident thereon. The first pixel further comprises readout circuitry configured to read out the first photoresponse and the second photoresponse.

According to another aspect of the invention, an apparatus to detect incident radiation is provided comprising a plurality of pixels arranged in an imaging area. The plurality of pixels comprises at least one pixel comprising a first photodetector having an upper wavelength detection limit in a short wavelength infrared (SWIR) spectrum and above approximately 1300 nm, and configured to produce a first photoresponse indicative of a quantity of radiation incident thereon. The at least one pixel further comprises a second photodetector having an upper wavelength detection limit in a visible spectrum and configured to produce a second photoresponse indicative of a quantity of radiation incident thereon. The at least one pixel further comprises readout circuitry configured to read out the first photoresponse and the second photoresponse.

According to another aspect, a method of determining a contribution of SWIR radiation to a first output signal of a first photodetector of a pixel comprising the first photodetector and a second photodetector is provided. The method comprises detecting a first range of wavelengths of radiation incident on the pixel using the first photodetector, the first range of wavelengths comprising the SWIR radiation and at least some visible radiation. The method further comprises producing the first output signal based on the detection of the first range of wavelengths. The method further comprises detecting a second range of wavelengths of the radiation incident on the pixel using the second photodetector, the second range of wavelengths comprising the at least some visible radiation, and producing a second output signal based on the detection of the second range of wavelengths. The method further comprises processing the first and second output signals to determine the contribution of the SWIR radiation to the first output signal. According to one embodiment, processing the first and second output signals comprises forming a linear combination of the first and second output signals.

According to another aspect, an apparatus is provided comprising a substrate formed of a first semiconductor material, and a plurality of pixels formed on the substrate and configured to detect radiation incident thereon. The plurality of pixels comprises a first pixel comprising a first photodetector formed of the first semiconductor material and disposed a first distance from a first side of the substrate, and a second photodetector formed of a second semiconductor material and disposed a second distance from the first side of the substrate. The apparatus further comprises readout circuitry configured to read out a first photoresponse of the first photodetector and a second photoresponse of the second photodetector.

According to another aspect an apparatus comprises a silicon substrate, and a plurality of pixels formed on the substrate and configured to detect radiation incident thereon. The plurality of pixels comprises a first pixel comprising a first photodetector formed of silicon, and a second photodetector formed of a semiconductor material other than silicon. The apparatus further comprises readout circuitry configured to read out a first photoresponse of the first photodetector and a second photoresponse of the second photodetector.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1A:
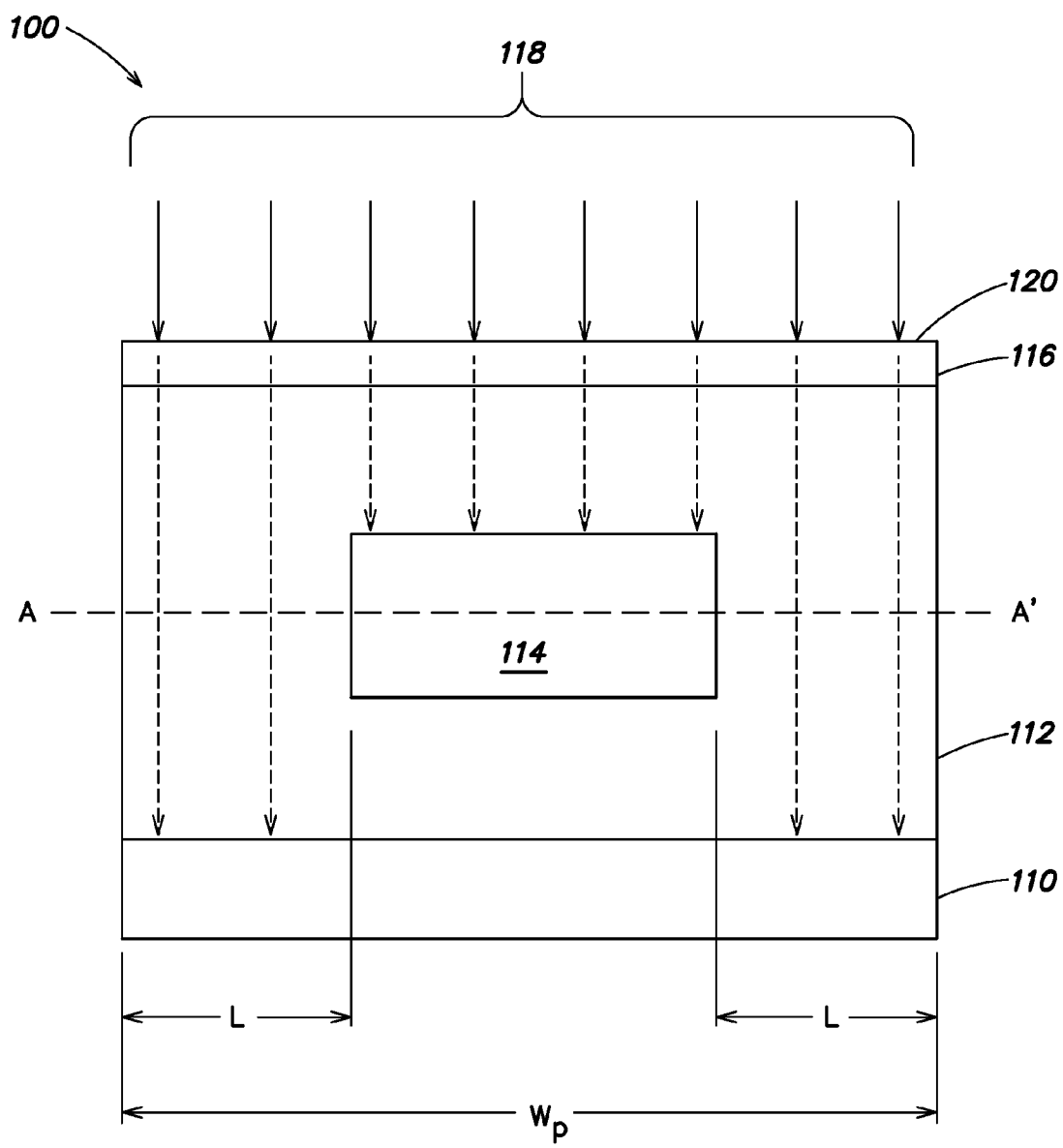
FIG. 1A shows a cross-section of a CMOS imaging pixel having a single photodetecting element, as known in the prior art.
Figure 1B:
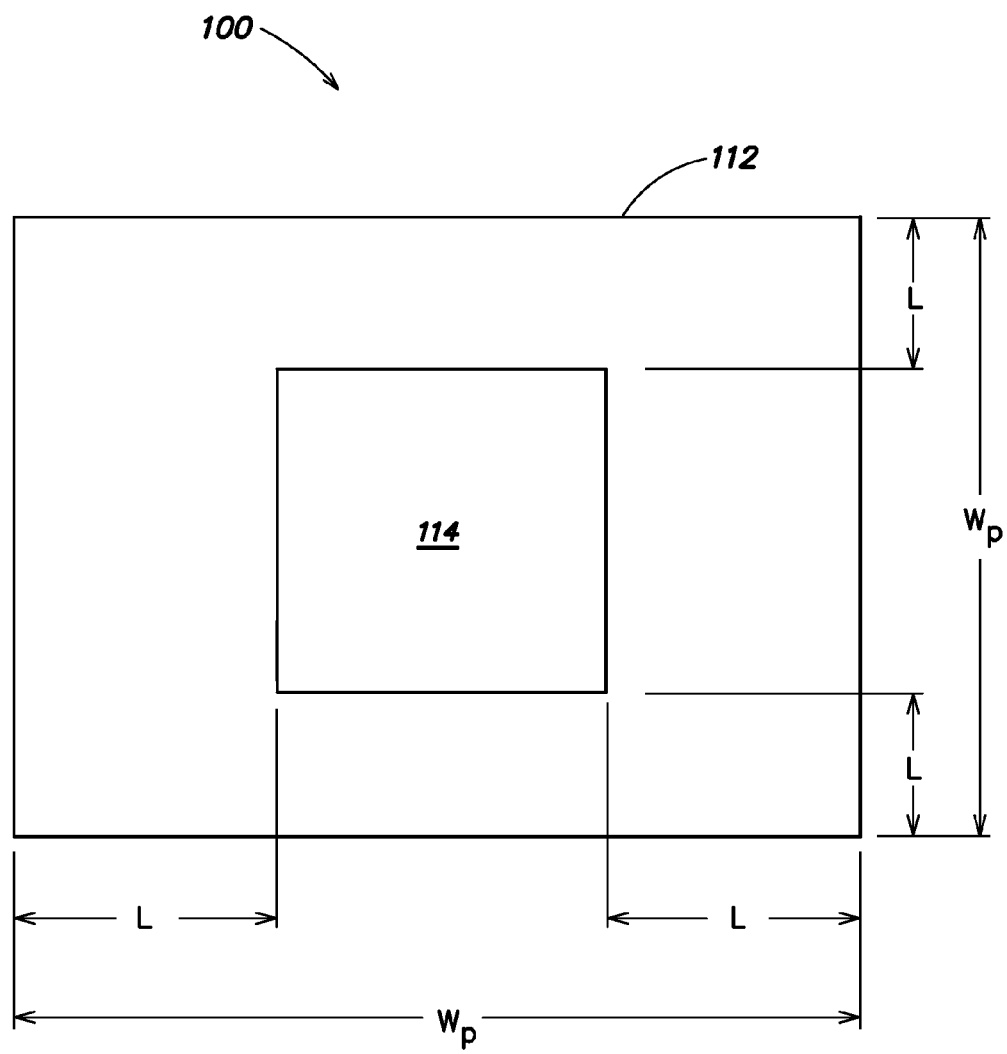
FIG. 1B is a top-down view of the pixel shown in FIG. 1A, taken along the line A-A' shown in FIG. 1A.

Applicants have appreciated that pixels of the type illustrated in FIG. 1A, i.e., pixel 100, do not detect all incident radiation. In operation, radiation 118 (indicated by arrows in FIG. 1A) is incident on a surface 120 of the pixel 100. The radiation proceeds (indicated by the dashed arrows) through the pixel 100, such that not all of the radiation 118 incident on the pixel 100 is incident on the photodetector 114. Rather, some of the radiation 118 bypasses the photodetector 114. The light that bypasses photodetector 114 is referred to as "stray light," and represents an inefficiency in the pixel design.

Figure 2:
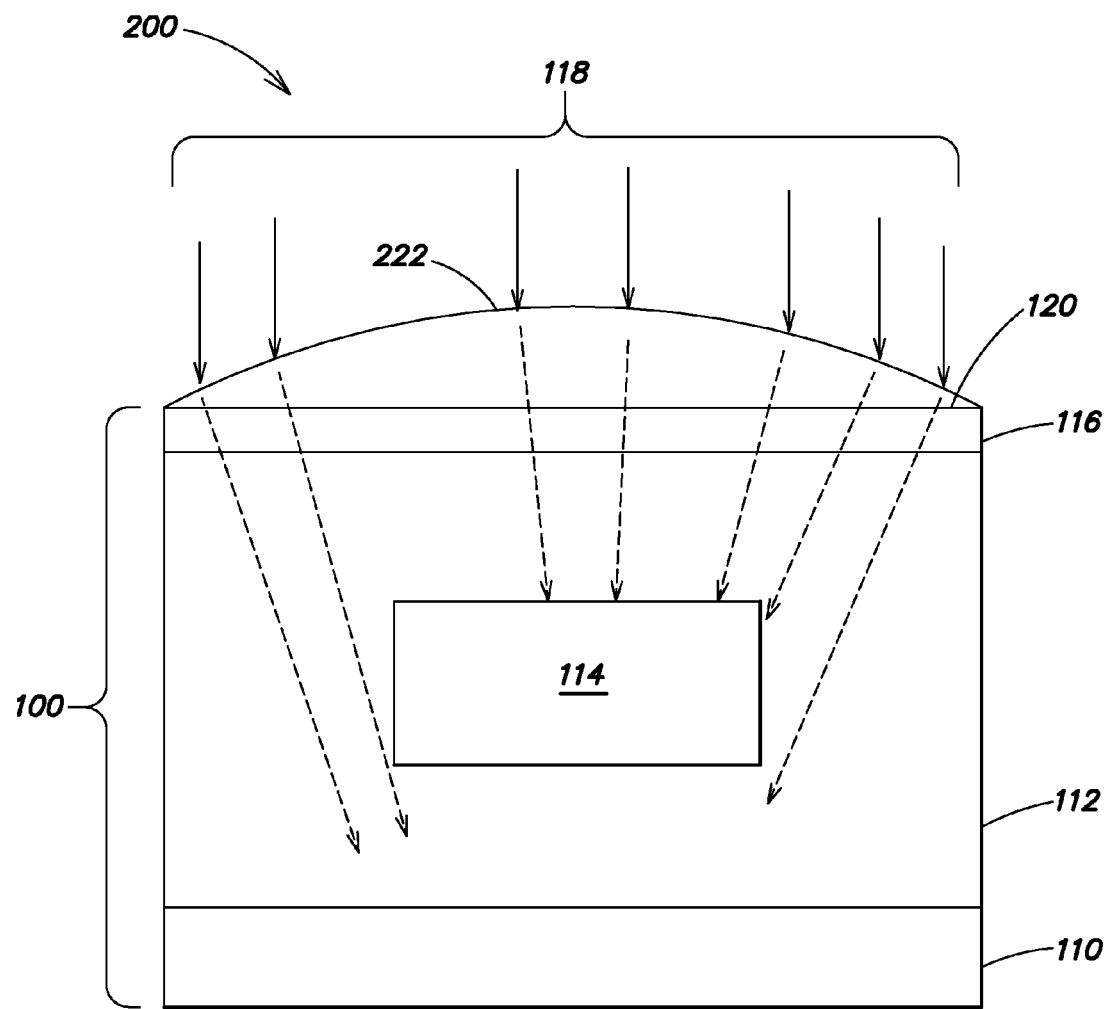
FIG. 2 shows a cross-section of the CMOS pixel of FIG. 1A in combination with a microlens, as known in the prior art.

Some imagers use a microlens to focus the radiation incident on the pixel toward the pixel photodetector. FIG. 2 illustrates the concept. The structure 200 includes the pixel 100 of FIG. 1A and a microlens 222. The microlens 222, placed on the top of the pixel 100, receives and focuses the incident radiation 118 toward the photodetector 114 (as indicated by the dashed arrows).

The use of a microlens does not entirely eliminate the occurrence of stray light. As shown in FIG. 2, some of the radiation 118, albeit less than in FIG. 1A, still bypasses the photodetector 114 due to imperfect focusing of the microlens 222. Perfect focusing of the microlens (i.e., focusing all the incident radiation 118 on the photodetector) is difficult to achieve due to competing design constraints.

On one hand, the surface area of the pixel, and therefore the size of the microlens, has a lower limit governed by signal-to-noise ratio (SNR) requirements. It is desirable to ensure that the pixel receives a sufficient amount of incident radiation to produce a large enough output signal to overcome electrical noise in the pixel. On the other hand, there can be practical constraints on how large the photodetector of the pixel can be (e.g., the competition for space with transistors and wiring). The result of these competing constraints is that not all of the light incident on the microlens is focused on the photodetector.

One aspect of the invention is directed to an imaging pixel comprising two photodetectors. One of the two photodetectors may be configured as a "primary" photodetector to detect radiation incident on the pixel, and the other may be configured to detect stray light that bypasses the primary photodetector, therefore improving the detection efficiency of the pixel. The two photodetectors may be capable of detecting different wavelengths, or ranges of wavelengths, of radiation, and they may be formed of the same material or different materials. For example, one photodetector may comprise substantially pure germanium and be capable of detecting visible, near infrared (IR), and short wavelength IR (SWIR) radiation, while the other may comprise substantially pure silicon and detect radiation in the visible and near IR spectra. However, this is just an example and other configurations are possible.

The two photodetectors may be shaped and arranged in any manner, as the aspects of the invention relating to imaging pixels with two photodetectors are not limited in this respect. For example, one photodetector may be configured such that, when viewed from above, it appears to surround the other photodetector of the pixel. Alternatively, the two photodetectors may be approximately the same shape, and may be arranged adjacent to each other, such that when viewed from above they appear to be approximately side-by-side. The photodetectors may be disposed in different planes within the pixel, or in a same plane. The pixel may optionally be combined in some (but not all) embodiments with a microlens to focus radiation onto one or both of the photodetectors.

According to another aspect of the invention, an imager pixel is provided that comprises two photodetectors and at least one filter. The two photodetectors may be capable of detecting different wavelengths, or ranges of wavelengths, of radiation incident on the pixel. This may be accomplished in any suitable manner, for example by forming the two photodetectors from different semiconductor materials. A single filter may be configured to filter incident radiation from reaching both of the photodetectors of the pixel. Alternatively, the pixel may comprise two filters, with each corresponding to a respective one of the photodetectors. The filters may be selected to filter out (or pass) any suitable range of wavelengths. For example, the two filters may comprise a color filter designed to pass light in a color band (e.g., Red, Green, Blue, Cyan, Yellow, or Magenta) as well as a filter designed to filter infrared radiation, such as a SWIR filter. The color filter may correspond to a first photodetector of the pixel designed to detect radiation in the visible spectrum, and the SWIR filter may correspond to the second photodetector of the pixel designed to detect infrared radiation. Other types and combinations of filters and photodetectors are possible, as the aspect of the invention related to the use of two photodetectors and one or more filters is not limited to any particular combination or configuration.

Another aspect of the invention is directed to an imager having pixels with multiple photodetectors that detect and differentiate between different wavelengths, or ranges of wavelengths, of incident radiation. The pixels may comprise two photodetecting elements, each capable of detecting a different (but possibly overlapping) range of wavelengths of incident radiation. The photodetectors can be formed in any suitable manner and be configured to detect any different ranges of wavelengths. For example, the first photodetecting element may be configured to detect radiation in the visible, near IR, and SWIR spectra, and the second photodetecting element may be configured to detect radiation in the visible and near IR spectra. The photodetectors may be formed in any suitable way, and in some embodiments are monolithicially integrated with a substrate to form a single monolithic structure. The photodetectors may be formed of any suitable materials. For example, the first photodetecting element may comprise substantially pure germanium, and the second photodetecting element may comprise substantially pure silicon.

The output signals of the two photodetecting elements may be selectively turned on and off. Accordingly, the imager may be operated in one of several modes. For example, in a first mode, the imager may be operated such that the output signals of both photodetectors of the pixel are provided and processed to form an image. In a second mode, only the output signal of the first photodetecting element is read and processed. In a third mode, only the output signal of the second photodetecting element is read and processed. The first mode may be selected to combine or otherwise process the outputs of both photodetectors in combination. The second and third modes may be selected depending on the operating environment of the imager, or for other reasons, as described in greater detail below. A user may select the mode of operation, or the mode of operation may be chosen in any other suitable manner.

According to one embodiment, one photodetecting element of each imager pixel is capable of detecting infrared radiation, while the second photodetecting element of each imager pixel is capable of detecting visible radiation. A user may select either the output signal of the first photodetector or the second photodetector, such that the imager may be operated either as an infrared imager, or a visible imager.

Various aspects of the invention are described in more detail below. These aspects may be used independently, all together, or in any combination of two or more.

Imaging Pixel Comprising Two Photodetectors

Figure 3A:
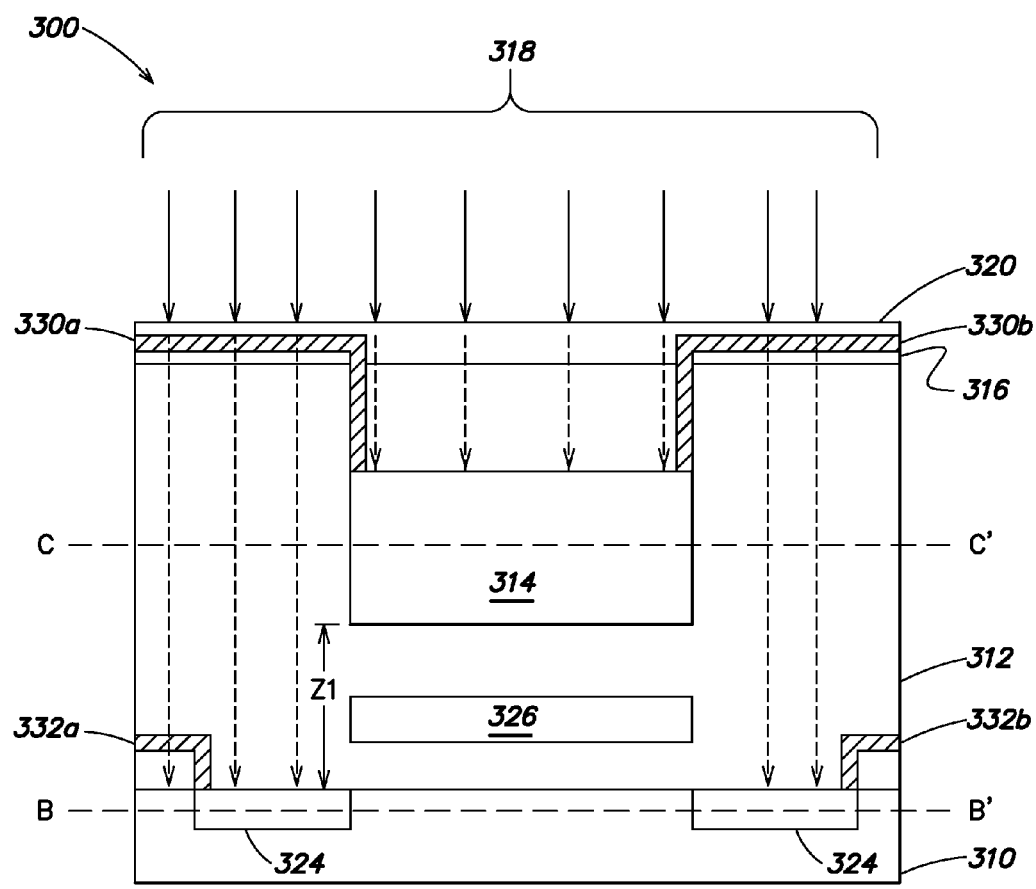
FIGS. 3A and 3B are cross-sectional and top-down views, respectively, of an imaging pixel comprising two photodetecting elements, according to one embodiment.

As discussed above, according to one aspect of the invention, an imaging pixel is provided comprising two photodetectors. FIG. 3A illustrates one non-limiting implementation of this concept, and shows a cross-section of a CMOS pixel having two photodetectors. The pixel 300 comprises a substrate 310, which may be a silicon substrate or any other type of substrate, as the aspect of the invention relating to a pixel with two photodetectors is not limited in this respect. In FIG. 3A, a first photodetector 324 is formed in the substrate 310 and has a surface co-planar with a surface of substrate 310, although other configurations are possible. For example, the first photodetector 324 can be formed any distance from a surface (e.g., a device, or active, surface, toward which incident radiation is directed) of the substrate 310. A second photodetector 314 is disposed in an insulating layer 312 on the substrate 310. Thus, the second photodetector 314 is separated by a different distance, Z1, from substrate 310 than is the first photodetector 324, which again in the non-limiting example of FIG. 3A is formed in the substrate. The distance Z1 may be at least 1 micron, or any other suitable distance, as the various aspects of the invention are not limited in this respect. Also, it should be appreciated that in some embodiments both photodetectors 314 and 324 may be formed in the substrate, for example by forming the photodetector 314 substantially co-planar with, and inside or next to, the photodetector 324. For example, the distance Z1 may be zero in some embodiments, or may take any other suitable value. It should be appreciated, by reference to FIG. 3A, that in some embodiments the two photodetectors are monolithically integrated with each other, and with the substrate.

The insulating layer 312 may be a dielectric material, or any other suitable material. While photodetector 314 is illustrated as being entirely embedded within the insulating layer 312, other configurations are possible. For example, the photodetector may only be partially embedded within the insulating layer 312, and may have a surface co-planar with a surface of the insulating layer 312, or in some embodiments may be disposed in the substrate.

The pixel 300 may (optionally) further comprise a backend layer 316 to passivate one or more underlying layers or to support the formation of additional pixel structures not shown (e.g., metalization layers, wiring, or other structures). The backend layer may be formed of any suitable material.

The photodetectors 314 and 324 may be any type of photodetectors, as the aspect of the invention that relates to employing two photodetectors in a pixel is not limited in this respect. For example, the photodetectors 314 and 324 may be capable of detecting the same wavelengths, or ranges of wavelengths, of incident radiation. When configured to detect the same range(s) of wavelengths, the two photodetectors may (for example) be formed of the same material. Alternatively, the photodetectors 314 and 324 may be designed and configured to detect differing wavelengths, or ranges of wavelengths, of incident radiation. This can be done in any suitable way, for example, by forming the two photodetectors from different materials. In one non-limiting implementation, photodetector 314 comprises substantially pure germanium and is capable of detecting radiation in the visible, near IR, and SWIR radiation spectra, and the photodetector 324 comprises substantially pure silicon and is capable of detecting visible and near IR radiation. Other materials may be used to form the photodetectors, as the aspect of the invention relating to a pixel with two photodetectors is not limited by the materials used to form the photodetectors.

Figure 11:
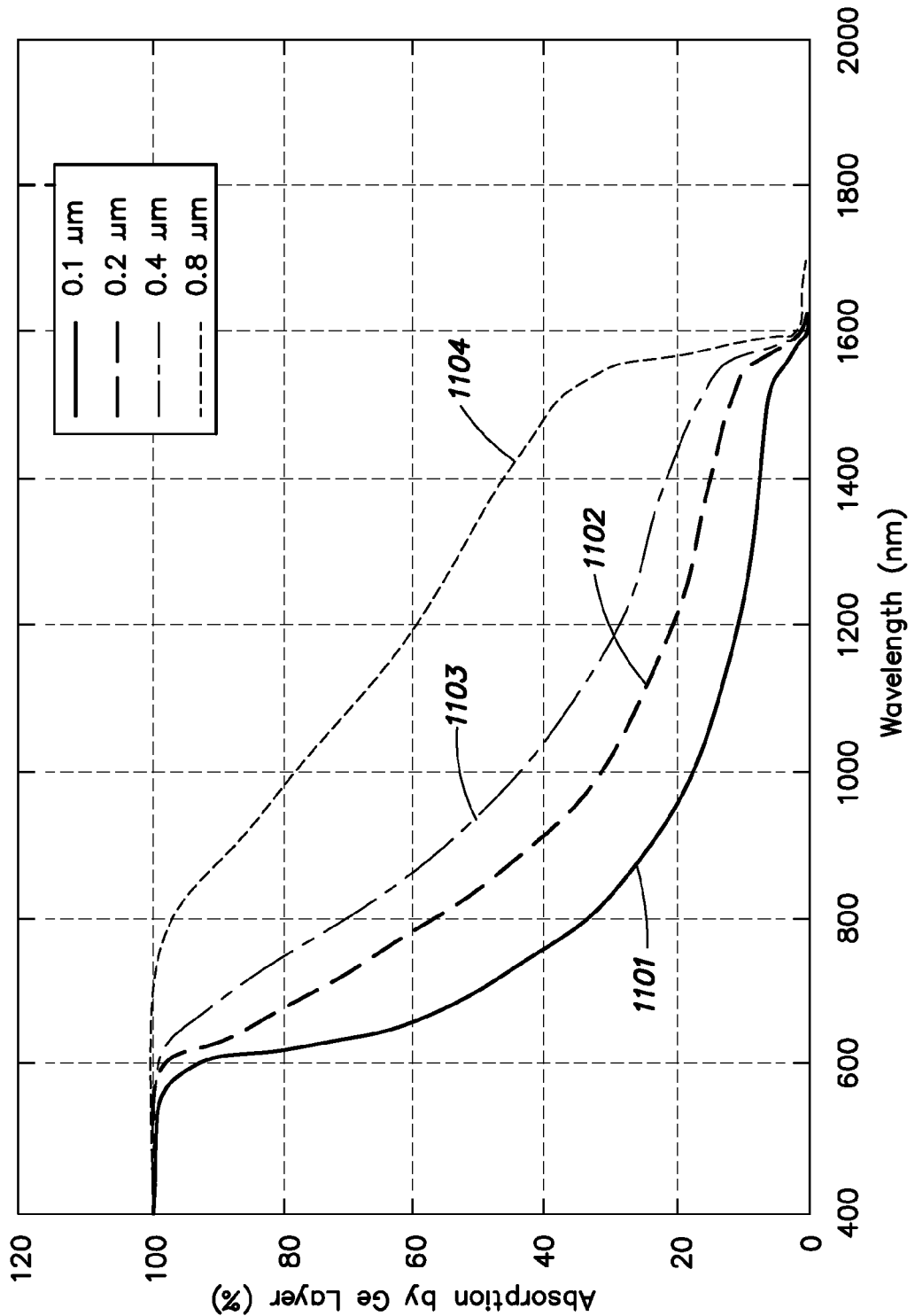
FIG. 11 illustrates absorption spectra for pure germanium having various thicknesses.

The photodetectors may have any suitable thicknesses to detect the intended range of wavelengths. For example, in one embodiment photodetector 314 may be configured to detect incident radiation in the visible, near IR, and SWIR spectra. Accordingly, photodetector 314 may have a thickness chosen to ensure absorption of a substantial percentage of incident radiation in these spectra. As an example, FIG. 11 illustrates absorption spectra for substantially pure germanium layers of differing thicknesses. The x-axis illustrates the wavelength of light absorbed and the y-axis illustrates the percentage of radiation of that wavelength which is absorbed. Line 1101 shows that a pure germanium layer having a thickness of approximately 0.1 microns absorbs substantially all incident radiation having a wavelength below 600 nanometers. Approximately 50% of incident radiation having a wavelength of 700 nanometers may be absorbed by a pure germanium layer having a thickness of approximately 0.1 microns. Line 1102 illustrates the absorption characteristics of a substantially pure germanium layer having a thickness of approximately 0.2 microns. Line 1103 illustrates the absorption characteristics of a substantially pure germanium layer having a thickness of approximately 0.4 microns. Line 1104 illustrates the absorption characteristics of a substantially pure germanium layer having a thickness of approximately 0.8 microns.

Accordingly, it will be appreciated that the thickness of the photodetectors described herein may be chosen to provide a desired percentage of absorption for a desired range of wavelengths depending on the nature of the material used for the photodetector. It will be appreciated that while FIG. 11 illustrates the absorption characteristics for pure germanium, the photodetectors and the filters described herein (e.g., the filters described below in connection with FIG. 7) are not limited to pure germanium, but may be formed from any suitable material. Absorption spectra for other types of materials (other than pure germanium), similar to those illustrated in FIG. 11, may be used to facilitate selection of the thicknesses of photodetectors and filters formed of those other types of materials.

Figure 3B:
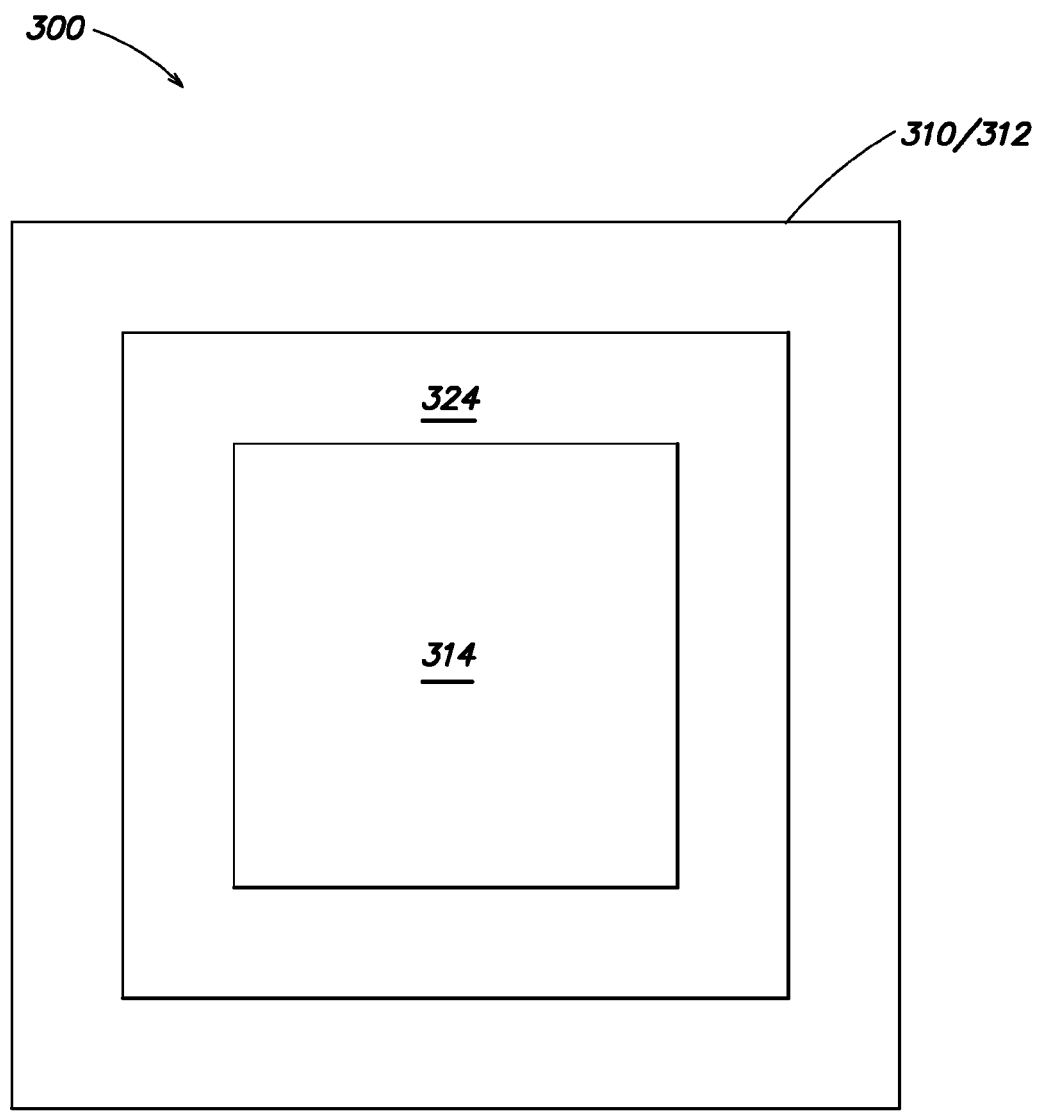

The shape and relative positioning of the photodetectors is also not limiting, and may be designed to optimize detection performance of one, or both, of the photodetectors. In FIGS. 3A and 3B (which shows a top-down view of the pixel 300 by superposing the planes represented by lines B-B' and C-C'), photodetectors 314 and 324 are formed within different planes of the pixel 300, i.e., photodetector 314 is formed within insulating layer 312 while photodetector 324 is formed within substrate 310 as described above. FIG. 3B illustrates that photodetector 314 has a solid, rectangular shape, while photodetector 324 is a closed contour (shaped like a collar, or ring with a rectangular outer surface) positioned (when viewed from the perspective of FIG. 3B) to surround photodetector 314. However, other shapes and configurations are also possible. For example, both photodetectors may be formed in the insulating layer 312 or both may be formed in the substrate. Furthermore, the photodetector 324 may have approximately the same shape (which is not limited to being rectangular) as photodetector 314, but with a larger surface area to catch light that bypasses photodetector 314, as described in greater detail below.

In one embodiment, the two photodetectors are configured to increase the pixel fill factor and reduce the amount of stray light in the pixel. In operation, radiation 318 (shown by arrows) is incident upon a surface 320 of the pixel 300. While the radiation is shown as being incident normal to surface 320, it will be appreciated that this is merely an example, and the radiation could be incident at any angle. The dashed arrows illustrate an exemplary path of the radiation within the pixel, although it will be appreciated that the path of the radiation within the pixel may depend on various factors, such as the incident angle, the material properties of the pixel structures, etc. Some of the radiation 318 is incident on photodetector 314. However, because photodetector 314 has a smaller surface area than that of the pixel 300, some of the radiation 318 bypasses photodetector 314. Photodetector 324 is positioned to detect at least some of the radiation which bypasses photodetector 314, thereby improving the detection efficiency of the pixel 300 compared to the efficiency provided by photodetector 314 alone.

Each photodetector within the pixel is capable of producing an output signal (i.e., photoresponse) in response to detecting incident radiation. The output signals may take any form and may be read out in any manner, as the invention is not limited in this respect. Readout circuitry may be included in the pixel 300, and may comprise wiring connected to the photodetectors 314 and 324 to read out the photoresponses. In the non-limiting example of FIG. 3A, the readout circuitry includes wiring 330a and 330b to read out the photoresponse(s) of photodetector 314, and wiring 332a and 332b to read out the photoresponse(s) of photodetector 324. The wiring 330a, 330b, 332a, and 332b may be formed of copper or any other suitable conducting material, and may take any suitable positioning within the pixel 300. In the non-limiting example of FIG. 3A, the wiring for the photodetector 314 is shown as being distinct from the wiring for the photodetector 324. Alternatively, in some embodiments, the wiring may be shared by the two photodetectors, or may be capable of being connected (e.g., shortcircuited) during operation, for example by placing a switch between the wiring for photodetector 314 (e.g., wiring 330a and 330b) and the wiring for photodetector 324 (e.g., 332a and 332b), for example to read out a single signal from the two photodectors. Moreover, it should be appreciated that in some embodiments additional readout circuitry may be provided within a pixel, such as transistors, capacitors, or any other suitable readout circuitry. In some embodiments, the readout circuitry may be provided outside the pixel.

The output signals of photodetectors 314 and 324 may be digital or analog signals. They may be read out separately as two distinct signals (i.e., a first output signal from photodetector 314 and a second output signal from photodetector 324), or they may be read out together, as a single output signal. For example, the output signal of photodetector 314 and the output signal of photodetector 324 may be provided off-chip as separate signals. Alternatively, they may be combined on-chip, with only the combined signal being provided off-chip. For example, the photodetector 314 and the photodetector 324 may be coupled by a switch, which, when closed, results in the output signal from photodetector 314 being combined with the output signal from photodetector 324.

Furthermore, the output signals may be processed in any manner, such as by forming a linear combination of the output signals (e.g., by subtracting one output signal from the other, scaling the output signals, or otherwise processing the output signals). According to one embodiment, a linear combination is formed of the output signal from photodetector 314 and the output signal from photodetector 324. As part of forming the linear combination, each output signal may be scaled by a suitable coefficient (i.e., scaling factor), with the coefficient applied to one of the output signals being of an opposite sign (i.e., positive or negative) as a coefficient applied to the other output signal(s).

The output signals may be processed on-pixel or off-pixel, on-chip or off-chip, by any suitable type of circuitry. According to one embodiment, a pixel with two photodetectors may be operated in at least two modes: (a) a first mode in which the photoresponses of the photodetectors are read out as two distinct signals; and (b) a second mode in which the photoresponses are read out together as a single signal. The mode of operation may be user-selected, or may be determined in any other suitable manner.

According to another embodiment, a pixel may comprise three or more photodetectors, and the pixel can be operated such that all three photoresponses are read out together, or may be operated such that the photoresponse of only one or two of the photodetectors is read out.

Multiple photodetectors within a single pixel can be used to provide various types of information. As one non-limiting example, the output signals of two photodetectors of a pixel may be processed in combination to provide an indication of the contribution of a particular range of wavelengths to the output signal of one or both of the photodetectors.

For example, photodetector 314 may be formed of substantially pure germanium, having an upper wavelength detection limit of approximately 1.6 microns and a lower wavelength detection limit of approximately 400 nm, so that is capable of detecting visible, near IR, and SWIR radiation. Photodetector 324 may be formed of substantially pure silicon, and may have an upper wavelength detection limit of approximately 1 micron and a lower wavelength detection limit of approximately 400 nm, so that it be capable of detecting visible and near IR radiation. The output signal from photodetector 324 may be used to determine the contribution of SWIR radiation to the output signal of photodetector 314 in any suitable manner. For example, first, the output signals of one or both of the photodetectors may be scaled so that the output signals of both photodetectors can be accurately compared. For example, the silicon photodetector 324 may naturally provide a larger photoresponse, or output signal, than photodetector 314. Accordingly, the output signal of photodetector 314 may be scaled (e.g., by linear scaling or any other suitable method) so that the output signals of photodetectors 314 and 324 may be accurately compared. The output signal of photodetector 324 may then be subtracted from the output signal of photodetector 314 to provide an indication of the amount of SWIR radiation contributing to the output signal of photodetector 314. This is merely one non-limiting example, as other types of photodetectors capable of capturing different wavelengths may be used and/or other forms of processing the output signals of the two or more photodetectors are possible.

The pixel 300 may further optionally comprise a layer 326 as shown in FIG. 3A. The layer 326 may be disposed in the insulating layer 312, and may function to re-direct some radiation toward one or both of the photodetectors 314 and 326, while blocking undesirable radiation from one or both of the photodetectors or from other circuitry within the pixel 300. For example, the layer 312 may reflect radiation impinging upon it, or may absorb such radiation. Furthermore, the layer 326 may prevent stray light from an adjacent pixel reflecting off the substrate 310 and into the photodetector 314, which would result in erroneous detection of the radiation at the point of pixel 300. As an example, stray light from one pixel may reflect off the substrate of the pixel 300 in FIG. 3A and proceed toward photodetector 314. However, the layer 326 may block that radiation from entering photodetector 314, thereby preventing the detection of light not associated with that pixel. The layer 326 may be formed of metal silicide or any other suitable material.

An example of layer 326 can be found in U.S. patent application Ser. No. 11/351,638, titled "Semiconductor Photonic Devices With Enhanced Responsivity And Reduced Stray Light," filed Feb. 10, 2006, and hereby incorporated by reference in its entirety. As described in that application, the layer 326 may comprise a reflective material, such as a metal silicide or other suitable material. It will be appreciated that the layer 326 is merely optional, and may be excluded entirely, as the various aspects of the invention are not limited in this respect.

As has been mentioned, pixel 300 (as well as the pixels described below according to one or more aspects of the invention) may include additional features not shown for purposes of simplicity. For example, pixel 300 may include additional readout circuitry beyond that shown, such as additional wiring or transistors, additional contacts to the photodetectors 314 and 324, or other structures, for example for the purpose of providing access to and reading out the photoresponses of photodetectors 314 and 324. Alternatively, such structures, such as circuitry for reading out the photoresponses of the photodetectors, may be outside the pixel, or in some cases implemented off-chip.

Fabrication Techniques

An imaging pixel having two photodetectors (e.g., pixel 300) may be fabricated using any suitable technology and processing sequence, as the various aspects of the invention are not limited in this respect. One illustrative semiconductor processing sequence for fabricating pixel 300 is illustrated with reference to FIGS. 4A-4E. However, it should be appreciated that the materials and steps mentioned are merely for purposes of illustration, and alternatives are possible. Also, it should be appreciated that some features of the pixel 300, such as wiring 330a, 330b, 332a, and 332b are excluded for simplicity.

Figure 4A:
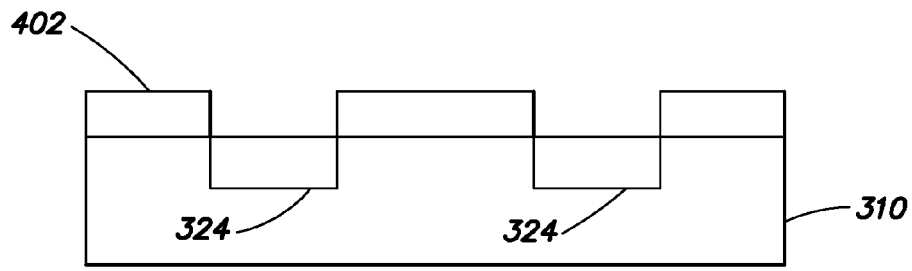
FIGS. 4A-4E show one illustrative process for fabricating pixel 300 of FIG. 3A.

FIG. 4A illustrates the formation of photodetector 324 in the substrate 310. The substrate 310 may comprise substantially pure silicon, or any other suitable substrate material. A mask layer 402 may be formed and patterned on the substrate 310 to define the shape of photodetector 324. The mask layer may be an oxide layer, or any other suitable masking material. After patterning of the mask layer 402, the photodetector 324 may be formed by implanting suitable dopants (e.g., boron and/or phosphorous) into the substrate 310. The remaining portions of mask layer 402 may then be removed by a chemical etch, or any other suitable removal technique.

Figure 4B:
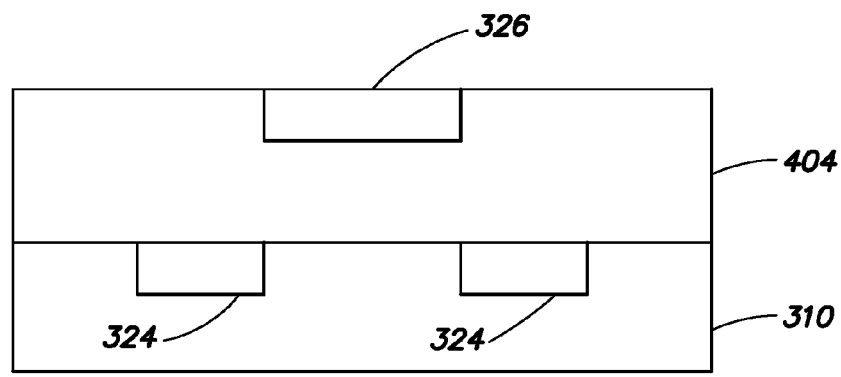

The fabrication process continues with the formation of layer 326, as shown in FIG. 4B. An insulating layer 404 may be formed on substrate 310 by growth, deposition, or any other suitable method. The insulating layer 404 may be an oxide layer, and may be the same type of material as mask layer 402. However, any suitable material may be used to form insulating layer 404. The layer 326 may be formed in the insulating layer 404 by patterning the insulating layer 404 (e.g., by lithography or any suitable technique) to form a well and then filling the well with layer 326 (e.g., by deposition, or otherwise). The layer 326 may be planarized, for example by chemical mechanical polishing (CMP), to be planar with the insulating layer 404.

Figure 4C:
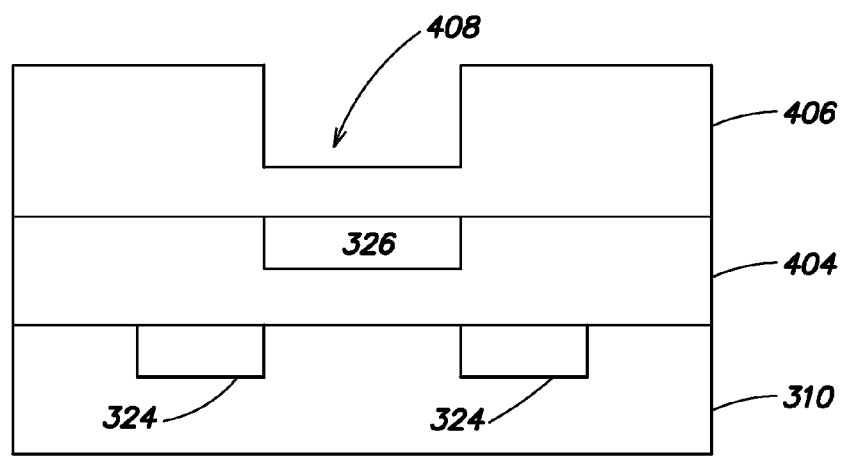

Next, the pixel may be prepared for the formation of photodetector 314, as shown in FIG. 4C. Another insulating layer 406 may be formed on the insulating layer 404 and be patterned to form a well 408, which may define the boundaries of photodetector 314. The insulating layer 406 may be an oxide layer or any other suitable insulating layer, and may be the same material as insulating layer 404. The well 408 may be formed by lithography or any other suitable technique.

Figure 4D:
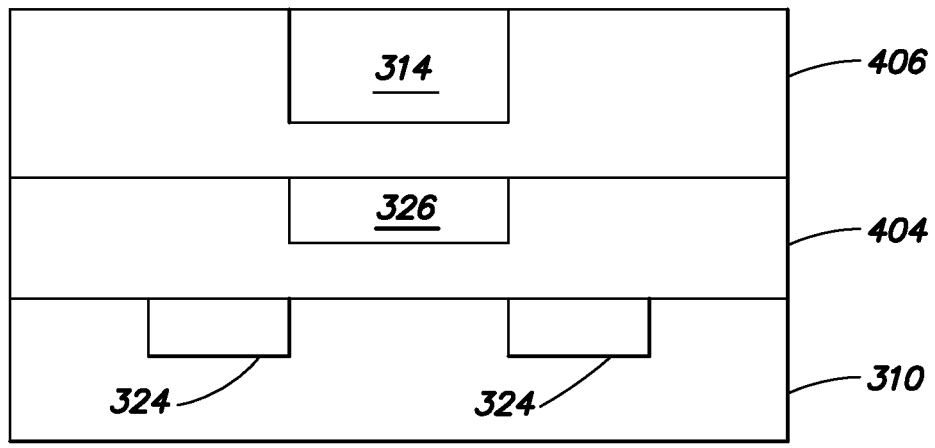

FIG. 4D then shows the formation of photodetector 314. Photodetector 314 may be formed to fill the well 408 of FIG. 4C, and may be planarized (e.g., by CMP or otherwise) to be substantially planar with insulating layer 406. Photodetector 314 may be formed by deposition, growth, or any other suitable technique. For example, in one embodiment photodetector 314 may comprise a SiGe alloy comprising a majority of germanium, and may be formed by growing the SiGe alloy epitaxially from the substrate 310. A trench (not shown) may be etched from well 408 through insulating layers 406 and 404 to the surface of substrate 310. A germanium seed layer may then be deposited in the trench and the photodetector 314 formed by growth from the germanium seed layer upward, filling the trench in insulating layers 404 and 406, and then filling well 408. It should be appreciated that this is one non-limiting example, and other methods for forming photodetector 314 may alternatively be used. For example, the photodetector 314 may be formed according to the methods described in U.S. Pat. No. 7,012,314, titled "Semiconductor Devices With Reduced Active Region Defects and Unique Contacting Schemes," by Bude et al, which is incorporated by reference herein in its entirety.

Figure 4E:
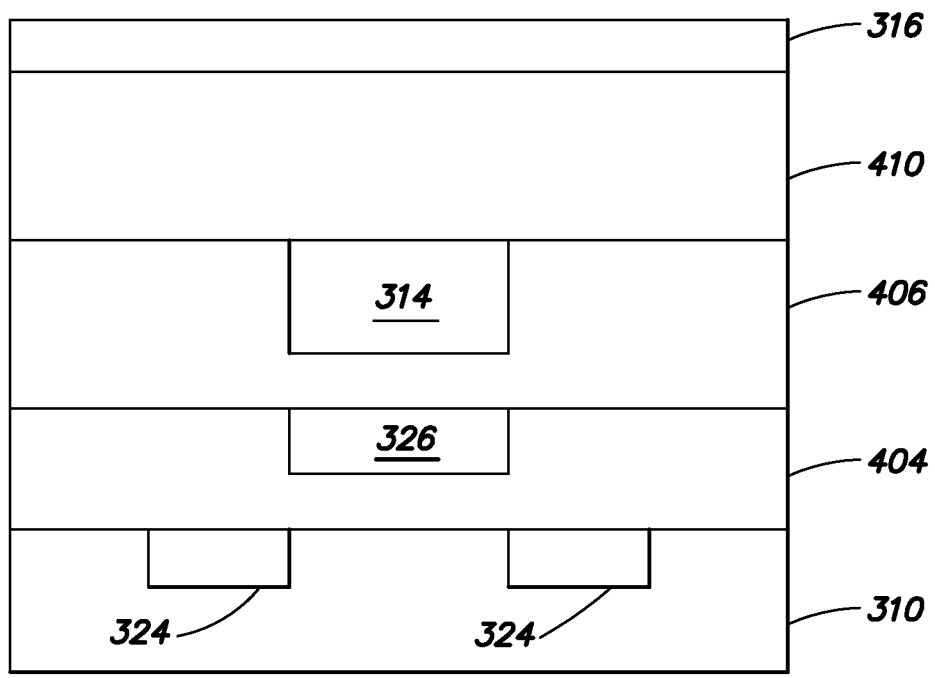

FIG. 4E shows the completion of the pixel by the formation of insulating layer 410 and backend layer 316. Insulating layer 410 may be an oxide layer, or any other suitable material, and may be formed by any suitable technique. The insulating layer 410 may be formed of the same material as insulating layer 406 and/or 404, although the process is not limited in this respect. The insulating layers 404, 406, and 410 may together form insulating layer 312 of FIG. 3. The backend layer 316 may be formed on insulating layer 410, for example by deposition, and may be planarized.

As mentioned, this is one non-limiting method for forming pixel 300. Other methods are possible. Furthermore, the other pixels described herein as examples of the various aspects of the invention may similarly be formed by any suitable techniques, such as standard semiconductor processing techniques.

Imaging Pixel Comprising Two Photodetectors in Side-By-Side Configuration

As mentioned, FIGS. 3A and 3B illustrate one non-limiting implementation of an imaging pixel comprising two photodetectors, according to an aspect of the invention. Other implementations are possible, as the aspect of the invention relating to an imaging pixel comprising two photodetectors is not limited to any particular implementation. For example, FIGS. 5A and 5B illustrate an alternative implementation of an imaging pixel comprising two photodetectors.

Figure 5A:
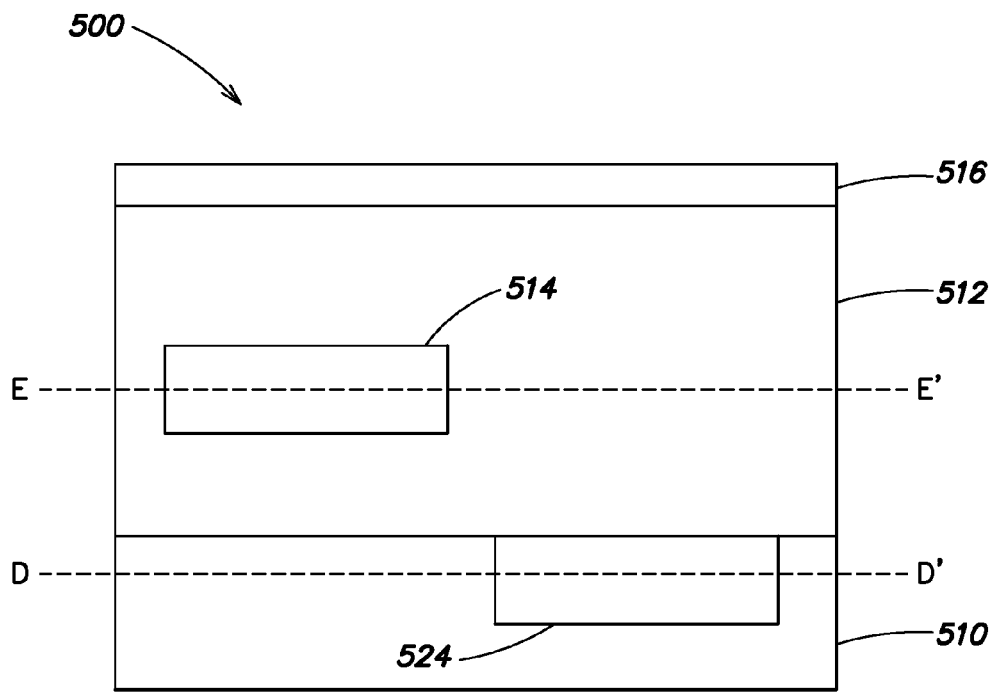
FIGS. 5A and 5B are cross-sectional and top-down views, respectively, of an alternative imaging pixel comprising two photodetecting elements, according to one embodiment.

FIG. 5A shows a cross-section of pixel 500 comprising a substrate 510 and an insulating layer 512 formed on the substrate 510. A first photodetector 524 is formed in substrate 510, and a second photodetector 514 is formed in the insulating layer 512. The pixel 500 further comprises a backend layer 516 similar to backend layer 316 in FIG. 3A, which may be a dielectric material or any other type of material. Readout circuitry, such as wiring connected to the photodetectors 514 and 524 to read out photoresponse(s) of the photodetectors, may also be included, but is not shown for simplicity.

The structures shown in FIG. 5A may be formed using any suitable materials, such as the materials described for the corresponding structures in pixel 300 of FIGS. 3A and 3B. For example, the substrate 510 may be a silicon substrate, or may be made of any other suitable substrate material. The insulating layer 512 may be a dielectric material, or any other suitable insulating material. Photodetectors 514 and 524 may be formed of any suitable material to detect a desired range, or ranges, of wavelengths of incident radiation. For example, photodetector 524 may be configured to detect radiation in the visible and near IR spectra, and may accordingly be formed of silicon (and may be the same type of material as the substrate material) or any other suitable material. Photodetector 514 may be configured to detect visible, near IR, and SWIR radiation, and accordingly may be formed of substantially pure germanium, a germanium alloy, or any other suitable material. The aspect of the invention relating to an imaging pixel comprising two photodetectors is not limited to any particular materials for the photodetectors.

Figure 5B:
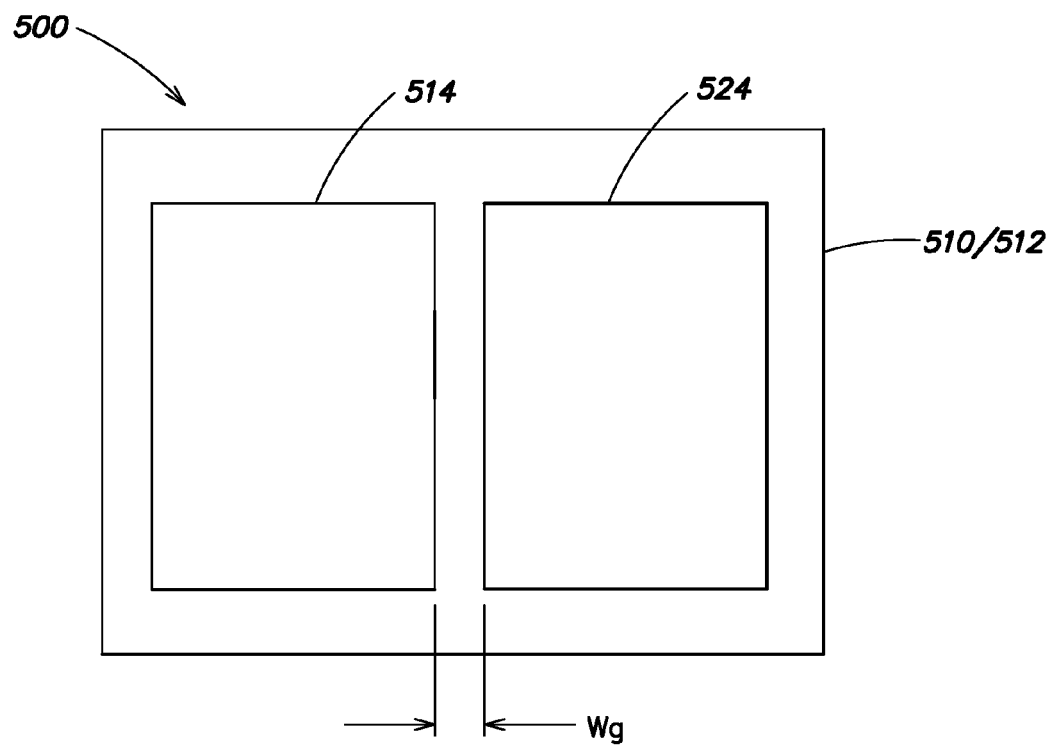

Moreover, in the non-limiting implementation of FIGS. 5A and 5B, the relative sizes of photodetectors 514 and 524 are not limiting. According to one implementation, photodetectors 514 and 524 may have approximately equal surface areas to each receive an approximately equal amount of incident radiation. Alternatively, the photodetectors 514 and 524 may have differing surface areas. Moreover, the proximity of photodetector 514 to photodetector 524 is not limiting, as the two photodetectors may be positioned in any suitable relative proximity to each other.

FIG. 5B illustrates a top-down view of the pixel 500 of FIG. 5A formed by superposing the planes of pixel 500 taken along lines D-D' and E-E'. As shown, photodetectors 514 and 524 assume a side-by-side configuration in this view. Also, the two photodetectors are shown with a gap, $W_g$, separating them in this view. It will be appreciated that the gap $W_g$ may have any value (including zero) and that the implementation of an imaging pixel comprising two photodetectors in a side-by-side configuration is not limited to any particular spacing of the photodetectors. It will be appreciated that other configurations are possible, and that the aspect of the invention relating to an imaging pixel comprising two photodetectors is not limited to photodetectors arranged in a side-by-side configuration.

Imaging Pixel Comprising Two Photodetectors and a Microlens

As mentioned above, according to another aspect of the invention, an imaging pixel comprising two photodetectors may be formed in combination with a microlens. The microlens may be shaped and positioned to focus incident radiation on one or both of the photodetectors, thereby improving the detection efficiency of the pixel and reducing the amount of stray light occurring in the pixel, and may be used with any of the illustrative pixel configurations described herein. The microlens may be formed of any suitable material and may be attached to the pixel in any suitable manner, for example by monolithic integration with the pixel, by glue, or by any other attachment technique.

Figure 6:
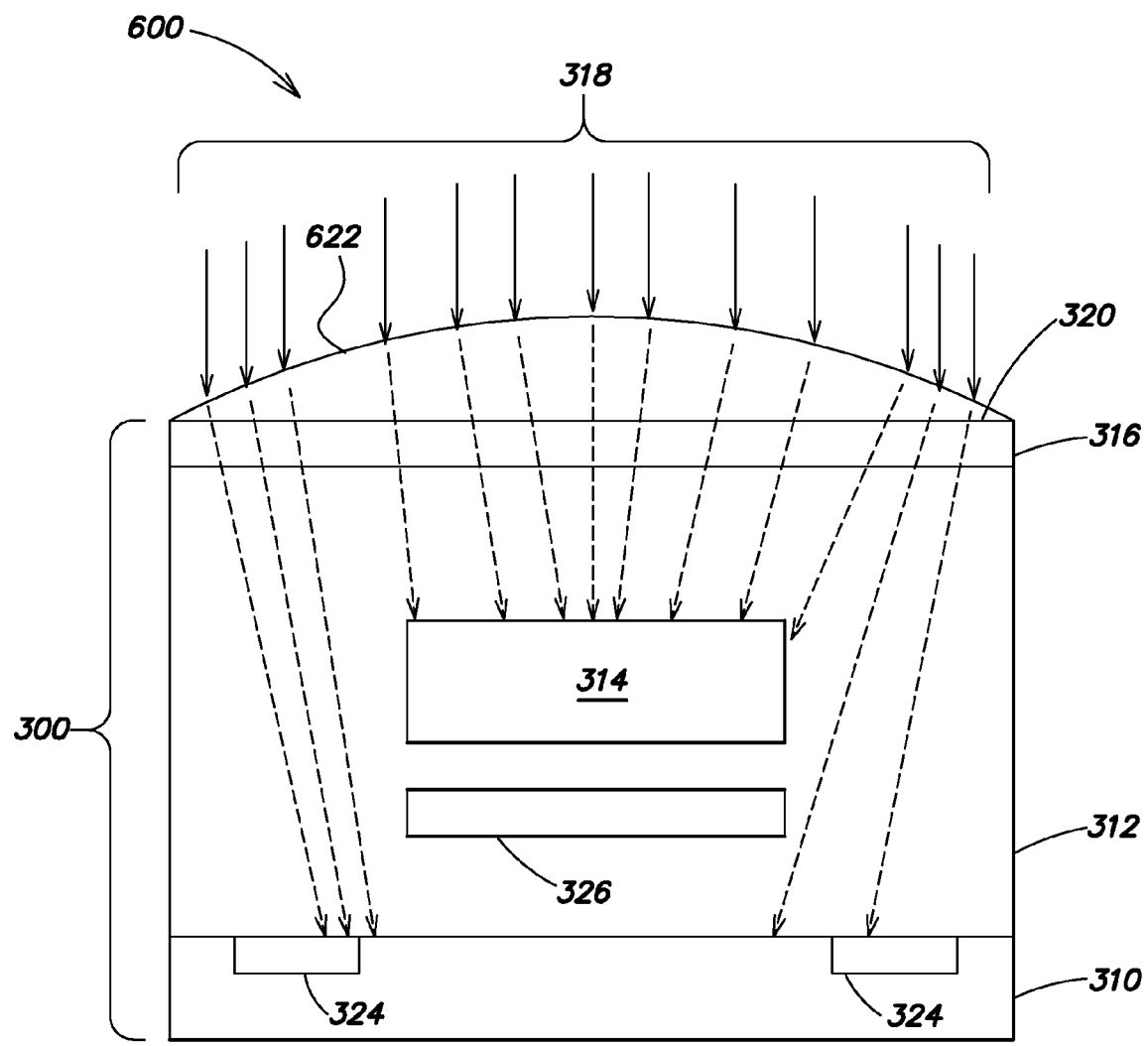
FIG. 6 shows a cross-section of pixel 300 from FIG. 3A in combination with a microlens, according to one embodiment.

FIG. 6 illustrates one non-limiting implementation of a pixel comprising two photodetectors in combination with a microlens, and specifically shows a cross-section of the pixel 300 of FIG. 3A (without the wiring 330a, 330b, 332a, and 332b) in combination with a microlens 622. The structure 600 comprises microlens 622 disposed at an imaging side of pixel 300 (i.e., the side of the pixel meant to receive incident radiation 318) on a surface 320 of backend layer 316. Microlens 622 receives and focuses the incident radiation 318 toward the photodetectors 314 and 324, as represented by the dashed arrows illustrating an exemplary path of the incident radiation in the pixel.

The focal point of the lens 622 may depend on the design characteristics (e.g., radius of curvature) and material properties (e.g., index of refraction) of the microlens. According to one embodiment, the design characteristics and material properties of microlens 622 are chosen such that the focal point of the microlens 622 is approximately at photodetector 314. Alternatively, the design characteristics and material properties may be chosen so that the focal point of microlens 622 lies approximately in-plane with photodetector 324. However, the microlens is not limited to any particular positioning of its focal point, and may be designed to focus light on either one of the photodetectors, both of the photodetectors, or neither of the photodetectors. Furthermore, the design of the microlens may be tailored to an anticipated operating environment of the structure 600, for example by being tailored to detection of IR radiation, visible radiation, or any other type of radiation.

FIG. 6 is only one exemplary implementation of a microlens in combination with an imaging pixel comprising two photodetectors. Other implementations are possible. As one additional example, a microlens, such as microlens 622, may be used in combination with pixel 500 in FIG. 5A, or with any other imaging pixel comprising two photodetectors.

Imaging Pixel Comprising Two Photodetectors and One or More Filters

As mentioned above, imaging pixels may be used in combination with, or may include, filters for the purpose of filtering one or more wavelengths of incident radiation from reaching the pixel's photodetector(s). The type and positioning of the filter used may vary depending on the wavelengths of incident radiation desired to be filtered or passed.

According to one aspect of the invention, an imaging pixel comprising two photodetectors further comprises one or more filters. The filters may restrict particular wavelengths within the visible and/or infrared spectra from reaching the pixel photodetectors. In one implementation, a color filter as well as a SWIR filter are used with a single pixel. However, the aspect of the invention relating to an imaging pixel comprising two photodetectors and one or more filters is not limited in this respect, as other types and combinations of filters may be used.

According to another aspect of the invention, an imaging pixel comprising two photodetectors further comprises a filter integrated with the imaging pixel. The filter may be monolithically integrated into the pixel using any suitable fabrication techniques. In one implementation, the imaging pixel is a CMOS pixel, and the filter is formed using CMOS processing techniques. The filter may comprise a semiconductor material (e.g., silicon, germanium, or a germanium alloy), or any other suitable material for performing the desired filtering function.

Figure 7:
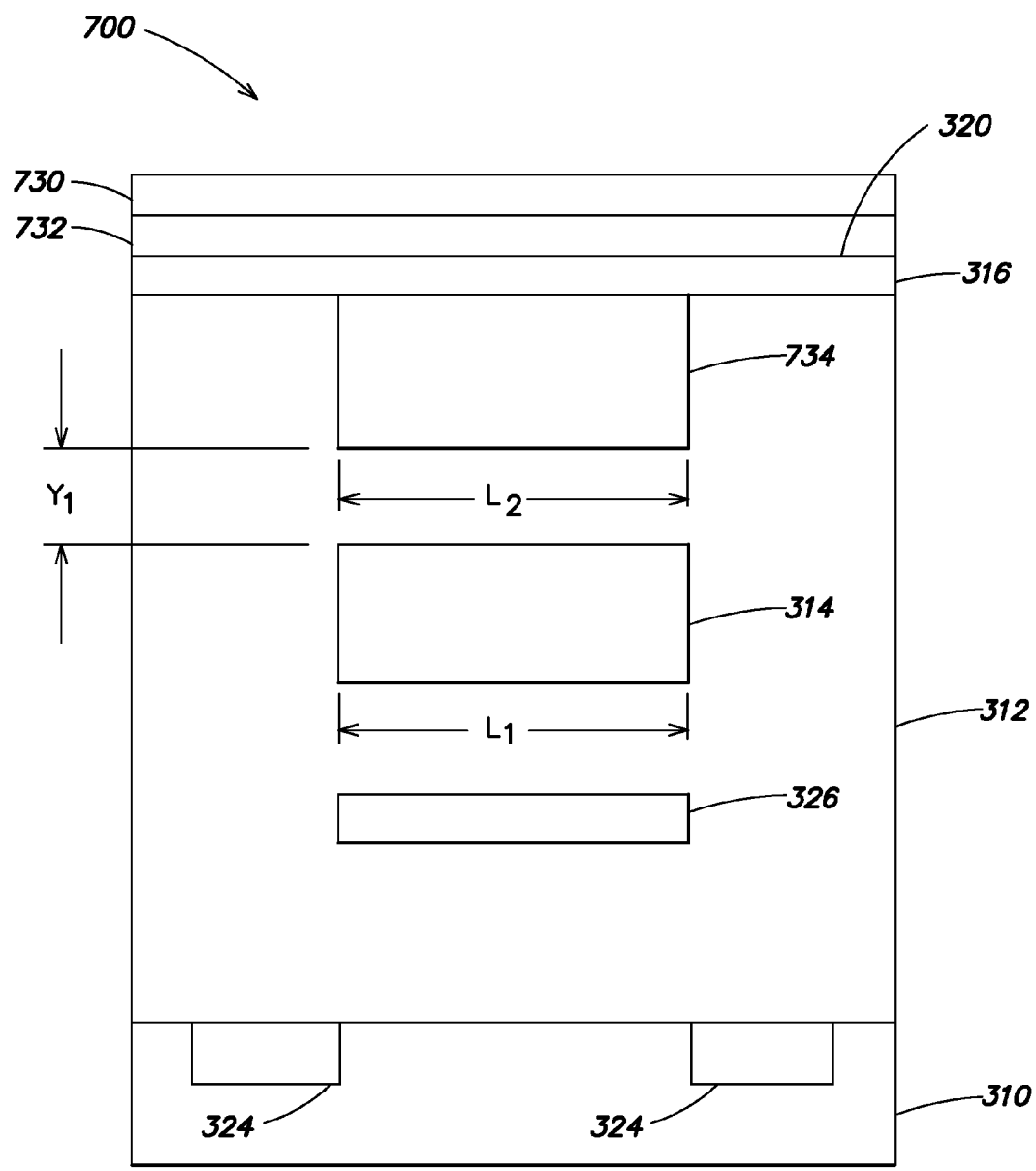
FIG. 7 is a cross-section of an imaging pixel comprising two photodetecting elements and two filters, according to one embodiment.

FIG. 7 illustrates one non-limiting implementation of a pixel with two photodetectors and one or more filters. As shown, pixel 700 is similar in many respects to pixel 300 of FIG. 3A. However, pixel 700 further comprises a color filter 730 on top of a glass layer 732. The color filter 730 and glass layer 732 each may be formed in any suitable manner, and may be formed of any suitable material. For example, the color filter 730 may be formed of a conventional polymer designed to pass one color of light (e.g., green light), while blocking other colors within the visible spectrum. Glass layer 732 may comprise any glass material, and may facilitate the formation of color filter 730, for example by providing a layer on which the color filter can be properly formed and shaped.

Pixel 700 further comprises a SWIR filter 734. The SWIR filter 734 may comprise any suitable material for filtering radiation in the SWIR spectrum, such as germanium, a germanium alloy, or any other suitable material capable of absorbing at least some radiation in the SWIR spectrum. The SWIR filter 734 may operate as a SWIR filter by blocking some wavelengths of radiation in the SWIR spectrum from reaching the photodetector 314, while allowing other wavelengths of radiation in the SWIR spectrum to reach the photodetector 314. An imager may employ pixels having different filters (e.g., of differing compositions) to detect different bands, or ranges of wavelengths, in the SWIR spectrum. The semiconductor material in SWIR filter 734 may have any crystal structure, (e.g., monocrystalline, polycrystalline, or amorphous), as the invention is not limited in this respect. The SWIR filter can be formed by any suitable fabrication technique, such as deposition, growth, or any other suitable method. The operation of the filter 734 is described in further detail below.

An example of a suitable SWIR filter is described in U.S. Provisional Patent Application Ser. No. 61/081,175, filed on Jul. 16, 2008, and entitled "IMAGING APPARATUS AND METHODS," by Rafferty et al., and in U.S. patent application Ser. No. 12/504,005, filed on Jul. 16, 2009, and entitled "IMAGING APPARATUS AND METHODS", by Rafferty et al., both of which applications are incorporated herein by reference in their entireties. Some of the text of those patent applications is reproduced below.

In the illustrative implementation of FIG. 7, SWIR filter 734 is disposed in insulating layer 312, above the photodetector 314, to filter radiation incident upon the pixel. As shown, the SWIR filter 734 has a surface substantially coplanar with a backend layer 316. However, the SWIR filter 734 can be oriented or positioned in other ways, while still being positioned between the imaging side of the pixel 700 (i.e., the side where incident radiation arrives) and the photodetector 314. For example, the SWIR filter 734 may be disposed in, and covered by, the insulating layer 312, may be angled relative to the surface of the backend layer 316, or may take any other suitable configuration.

The SWIR filter 734 may be positioned and dimensioned in any suitable manner. For example, the SWIR filter 734 may have any length $L_2$, and may advantageously have a length $L_2$ equal to, or greater than, a length $L_1$ of the photodetector 314. However, the embodiments utilizing a SWIR filter are not limited to any particular size or positioning of the SWIR filter. Similarly, the proximity of SWIR filter 734 to photodetector 314 is not limiting, as the two pixel components may be separated by any suitable distance $Y_1$. In one embodiment, the distance $Y_1$ may be chosen to be small, to improve the efficiency of the SWIR filter 734 by increasing the likelihood that radiation incident upon the pixel 700 must pass through, and not around, the SWIR filter 734 to reach the photodetector 314. The SWIR filter 734 may be positioned approximately symmetrically above the photodetector 314 in the dimension of the lengths $L_1$ and $L_2$, as shown, although the aspect of the invention utilizing a SWIR filter is not limited to any particular placement of the SWIR filter. In one embodiment, the relative positioning of the photodetector 314 and SWIR filter 734 may be chosen to ensure that radiation incident on the pixel 700 must pass through the SWIR filter 734 to reach the photodetector 314, for example by positioning the SWIR filter 734 between the photodetector 314 and the imaging side of the pixel (i.e., the side of the pixel meant to receive incident radiation), and by making SWIR filter 734 large enough to intercept radiation incident on the pixel that may reach the photodetector. The SWIR filter may have any thickness suitable to filter the intended range of wavelengths. For example, the thickness of the SWIR filter may be chosen based on the spectra of FIG. 11 (previously described) or any other suitable criteria.

The SWIR filter 734 may be made of any suitable material. In accordance with one embodiment, the SWIR filter 734 may comprise a semiconductor material. For example, the SWIR filter 734 may comprise a silicon-germanium alloy capable of absorbing at least some radiation in the SWIR spectrum. The semiconductor material in SWIR filter 734 may have any crystal structure (e.g., monocrystalline, polycrystalline, or amorphous), as the embodiment utilizing a SWIR filter are not limited in this respect.

In operation, radiation may be incident upon the pixel 700. The radiation may pass through color filter 730, glass layer 732, and backend layer 316 to reach SWIR filter 734. In the embodiments in which the SWIR filter 734 is formed of a semiconductor material, it may function as an absorption filter, i.e., absorbing some of the radiation, while passing some of the radiation to the photodetector 314, although other mechanisms of operation of the SWIR filter are also possible.

Figure 8A:
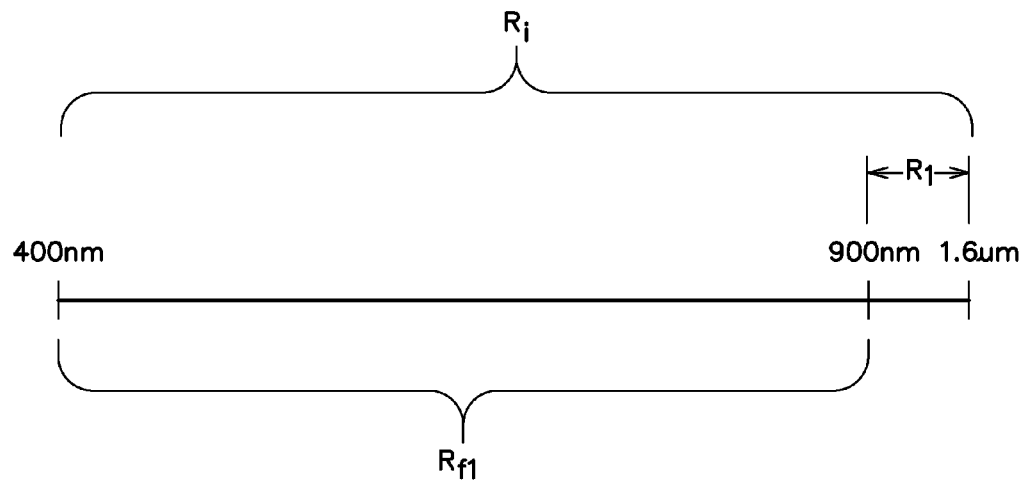
FIGS. 8A and 8B illustrate radiation spectra relating to the operation of a SWIR filter, according to one embodiment.

For example, as shown in FIG. 8A, the incident radiation may include a range $R_i$ of wavelengths from approximately 400 nm to approximately 1.6 microns, although this is merely one non-limiting example of the type of incident radiation possible. For purposes of this non-limiting example, photodetector 314 is formed of substantially pure germanium and may therefore be capable of detecting the entire range $R_i$ of wavelengths, and the SWIR filter 734 may be a silicon-germanium alloy having a sufficient thickness to absorb a majority of the incident radiation in the range $R_{f1}$ from approximately 400 nanometers to approximately 900 nanometers. As a result, in the non-limiting example of FIG. 8A, the only wavelengths of incident radiation which reach the photodetector 314 are those in range $R_1$, comprising wavelengths from approximately 900 nanometers to approximately 1.6 microns.

Figure 8B:
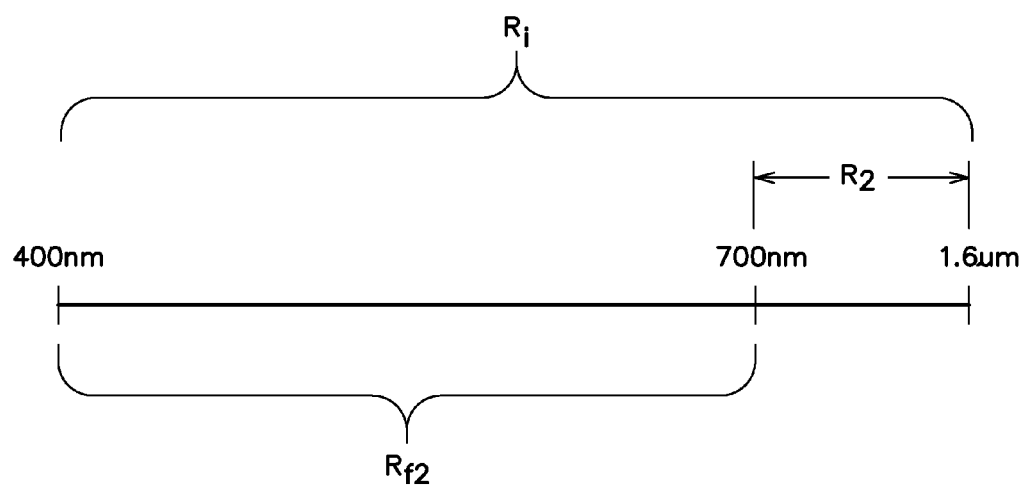

FIG. 8B illustrates the operation of a different filter 734 having a different composition than that producing the results shown in FIG. 8A. As shown in FIG. 8B, the incident radiation may include the range $R_i$ of wavelengths from approximately 400 nm to approximately 1.6 microns. Again, for purposes of this non-limiting example, the photodetector 314 may be capable of detecting the entire range $R_i$ of wavelengths. The SWIR filter 734 may be a silicon-germanium alloy having an upper cutoff wavelength of approximately 700 nanometers. For example, the SWIR filter 734 in this example may comprise a lower percentage of germanium than the SWIR filter 734 producing the results shown in FIG. 8A. In the example of FIG. 8B, the SWIR filter 734 may absorb substantially all of the incident radiation in a range $R_{f2}$ from approximately 400 nm to approximately 700 nanometers. As a result, the only wavelengths of incident radiation which reach the photodetector 314 are those in a range $R_2$, comprising wavelengths from approximately 700 nanometers to approximately 1.6 microns. In the non-limiting examples of FIGS. 8A and 8B, it should be appreciated that the range $R_1$ is a subset of the range $R_2$.

As demonstrated by the two non-limiting examples of FIGS. 8A and 8B, the combination of the SWIR filter 734 and the photodetector 314 can be designed to provide detection of different bands of wavelengths in the SWIR spectrum. The ranges of wavelengths detected (i.e., ranges $R_1$ and $R_2$) may be determined by appropriate choice of the photodetector and the SWIR filter. The photodetector material may determine the maximum detectable wavelength of the photodetector, e.g., 1.6 microns in FIGS. 8A and 8B, while the SWIR filter 734 may determine the lower wavelength limit of radiation that reaches, and therefore is detectable by, the photodetector 314 by absorbing wavelengths below this lower wavelength limit. In some embodiments, the upper and lower wavelengths of radiation detected by a photodetector 314 may each be selected to have a value anywhere in the range from approximately 400 nanometers to approximately 1.6 microns. For example, the upper and lower wavelengths of radiation detected by photodetector 314 may be at least partially determined by suitable selection of the materials used to form the photodetector 314 and the SWIR filter 734, as well as the thicknesses of the structure. Reference is made to FIG. 11 as one non-limiting example of how the type of material and the thickness of the material may be selected to provided the desired absorption functionality.

In the non-limiting example of FIG. 7, color filter 730 may be a green filter, therefore blocking blue and red radiation within the visible spectrum, while passing green light and radiation in the near IR and SWIR spectra. Conventional polymeric color filters for MOS systems (e.g., conventional red, green, blue, cyan, yellow, and magenta filters) may display such behavior in which they pass light corresponding to a single color in the visible spectrum and also pass light in the near IR and SWIR spectra. Accordingly, of the radiation incident on pixel 700, photodetector 324 only receives green light and any incident light in the near infrared and SWIR spectra. However, because photodetector 324 may comprise substantially pure silicon having an upper wavelength detection limit of approximately 1 micron, and may therefore be incapable of detecting SWIR radiation, the output signal of photodetector 324 may represent only the visible green light incident on the pixel.

SWIR filter 734 may filter (e.g., by absorption or any other mechanism) wavelengths below some upper wavelength limit in the SWIR spectrum (e.g., 1.2 microns), for example by comprising a silicon-germanium alloy The presence of SWIR filter 734 therefore may restrict the ranges of wavelengths of radiation that reach photodetector 314 to SWIR radiation above the upper wavelength filtering limit of SWIR filter 734 (e.g., 1.2 microns). From this non-limiting example, it should be appreciated that the detection characteristics of a pixel, such as pixel 700, can be customized by appropriate selection of filters (such as color filter 730 and SWIR filter 734) to detect any desired ranges of visible and SWIR radiation, as this aspect of the invention is not limited to any particular combination of filters or photodetectors.

Furthermore, as described below, pixels with different filters (and therefore different detection ranges) can be combined in any suitable way in an imager and can be processed to achieve any desired image(s).

Imager

According to one aspect of the invention, an imager is provided having pixels implemented according to any of the techniques discussed above. The pixels may be arranged in an imaging array, and each pixel may comprise two types of photodetecting elements, each capable of detecting a different (but possibly overlapping) range of wavelengths. For example, each pixel may comprise a first type of photodetector capable of detecting visible, near IR, and SWIR radiation, as well as a second type of photodetector capable of detecting only visible and near IR radiation. However, the concept of employing in an imager one or more pixels having two or more photodetectors may be implemented using other types of photodetectors, and is not limited to implementation with any particular types of photodetectors. Moreover, not all of the pixels of the imager need to include multiple photodetectors.

An imager comprising pixels having multiple types of photodetecting elements may be operated in various modes. For example, the photoresponses of the photodetecting elements may be read out simultaneously, or at separate times. Accordingly, the imager may be a dual-function imager, capable of operation as both a visible (e.g., color) imager and an IR imager. Other methods of operation are also possible.

Figure 9:
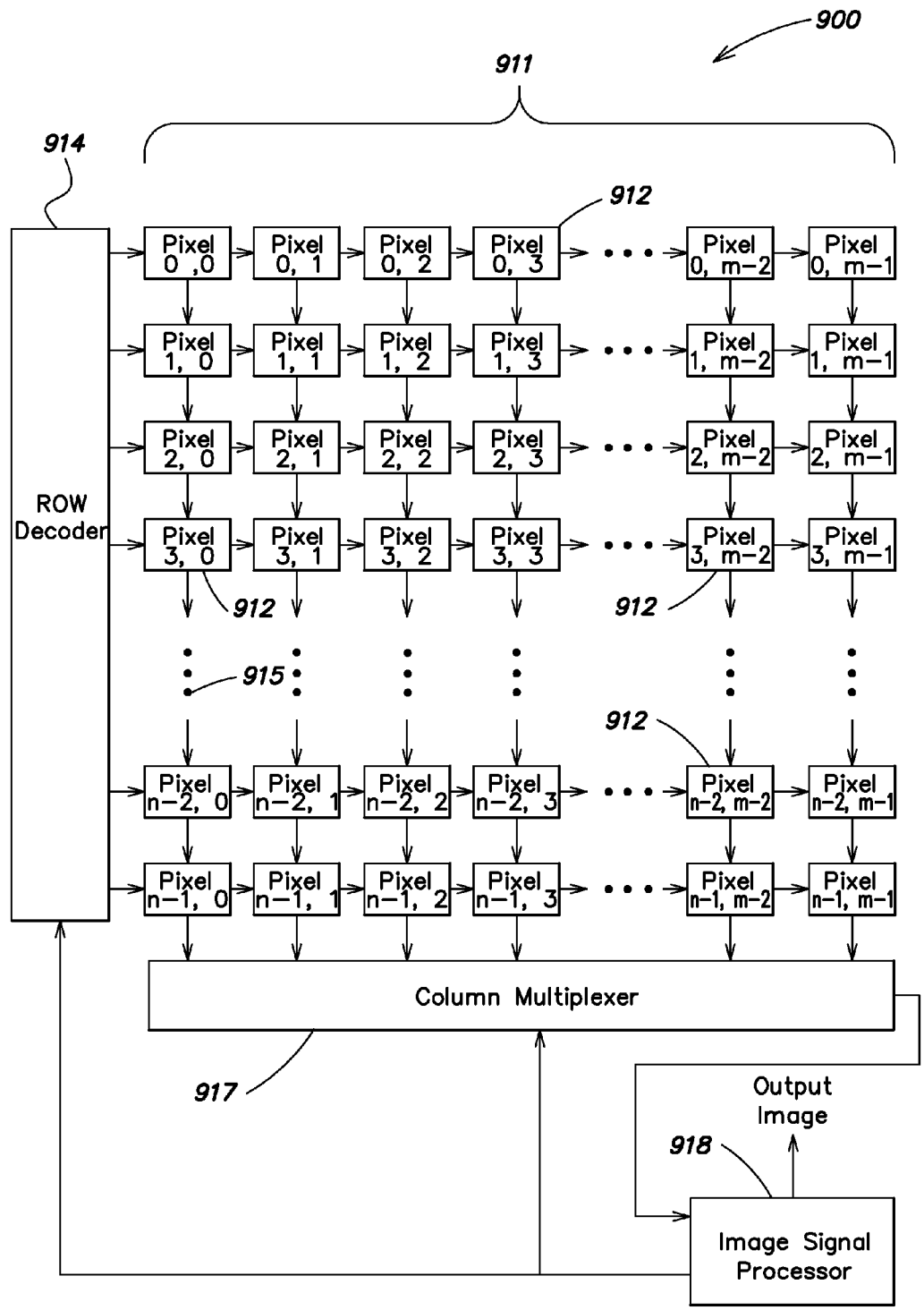
FIG. 9 illustrates an imager configuration which may employ one or more of the types of pixels described herein.

FIG. 9 illustrates a schematic block diagram of a CMOS imager 900. The imager 900 comprises an array 911 of pixels 912, arranged in an n-row by m-column configuration. The pixels 912 may each contain two photodetecting elements as discussed above, multiplexing circuitry to control the readout of the pixels, and may optionally include signal amplification and processing circuitry. Each photodetector may generate one or more output signals proportional to the accumulated incident radiation detected by the photodetector, and these output signals may be used by the image signal processor 918 to produce the resulting image.

The reading out and processing of the photodetector output signals can be accomplished in any manner. For instance, the pixels 912 in a single row can be controlled by a set of row signals generated by a row decoder 914. The row decoder may contain circuits that perform row address and timing functions within the pixel, such as controlling pixel reset and the length of time during which the pixel detects radiation, often referred to as the integration period. The pixels in a single row may be output onto a column bus 915 at the same time, while pixels in different rows can be output at different times. Staggering the outputs of rows of pixels in this manner allows the pixels in a column to share column bus 915, multiplexing their output signals sequentially onto the column bus one row at a time. All the pixels 912 in a single column may send their output signals to a column multiplexer 917 via the column bus 915.

Processing of the pixel output signals is performed by the column multiplexer 917 and the image signal processor 918 to produce the desired image. Additional circuitry (not shown) within the column multiplexer 917 may perform a number of functions, including amplification, noise reduction, and multiplexing into predefined video or image formats, e.g., a standard TV video sequence. The video or image signals generated by the column multiplexer 917 can be further processed by image signal processor 918 to reorganize, improve, and enhance the resulting image. For example, the image signal processor may detect and highlight edges in the image, may adjust the average image intensity using control signals to modify the length of the integration, etc.

While imager 900 represents one possible configuration of an imager according to aspects of the invention, other implementations are possible, as the aspects of the invention that relate to forming an imager with one or more pixels having two or more photodetectors are not limited to any particular imager design.

The pixels 912 of imager 900 may be any of the types of pixels described thus far (e.g., pixel 300 in FIGS. 3A and 3B, pixel 500 in FIGS. 5A and 5B, structure 600 in FIG. 6, pixel 700 in FIG. 7, etc.). Similarly, the array 911 may comprise any combination and arrangement of the types of pixels described thus far, as this aspect of the invention is not limited to any particular combination or arrangement of pixels. For example, the array 911 may comprise a first subset of pixels like that shown in FIG. 3A, and a second subset of pixels like that shown in FIG. 7. Other combinations are also possible.

According to one non-limiting implementation, the imager 900 comprises pixels 912 of the type shown in FIG. 3A (e.g., pixel 300). In this non-limiting example, the photodetector 314 comprises substantially pure germanium and is capable of detecting visible, near IR, and SWIR radiation, and photodetector 324 comprises substantially pure silicon, and is capable of detecting visible and near IR radiation. Therefore, the two photodetectors of the pixels 912 detect differing ranges of wavelengths.

In this non-limiting implementation, the imager 900 is capable of operation in two modes. In a first mode of operation, only the output signals of photodetectors 324 of each pixel 912 are read out and processed. Accordingly, in this mode, the imager 900 operates as a visible imager. In a second mode of operation, only the output signals of photodetectors 314 of the pixels 912 are read out and processed. Accordingly, in this mode, the imager 900 operates as an infrared imager. It will be appreciated that other modes of operation are possible, as, for example, the output signals of both photodetectors of each pixel could be read out simultaneously and processed.

It will also be appreciated that the operating modes just described enable production of two types of images relating to a single instant in time. For example, a visible image and an infrared image may be formed for each instant in time, for example by reading out and processing the photoresponses of both photodetectors of the pixel at a same instant in time.

The mode of operation of the imager 900 may be selected by a user or may be determined in any other suitable manner. For example, a user may select the first mode of operation (i.e., the visible mode of operation) when the imager is being used in daylight conditions, and may select the second mode of operation (i.e., the infrared mode) when using the imager 900 in dusk or nighttime conditions.

The mode of operation of the imager 900 may be selected additionally or alternatively based on various additional factors, including the power consumption of the imager, the quality of the resulting image desired, or any other factors. For example, the power consumption of the imager 900 may depend upon, and may be selected by, the operating mode of the imager. In the non-limiting example in which the pixels 912 of the imager 900 comprise a photodetector 314 comprising substantially pure germanium and a photodector 324 comprising substantially pure silicon, it may be necessary in some embodiments to cool the imager to ensure accurate read outs from the germanium photodetectors 314, which typically involves power consumption (e.g., to operate one or more fans). When operating in the first mode of operation, in which the germanium photodetector output signals are not read out and processed, it may not be necessary to cool the imagers, thereby reducing the power consumption of the imager.

While two modes of operation have been described in which only one of the two photodetectors of the pixels 912 of the imager 900 are read out and processed, it may be desirable to read out and process the output signals of both photodetectors of the pixels 912 for any number of reasons. For example, the output signals of the photodetectors 324 comprising substantially pure silicon may improve the quality of an infrared image produced by reading out and processing the output signals of the photodetectors 314 comprising substantially pure germanium. The output signals of the substantially pure germanium photodetectors may represent an amount of SWIR radiation incident on those photodetectors, but may also represent some amount of visible or near IR radiation incident on those photodetectors. The output signals of the substantially pure silicon photodetectors 324 may represent visible and near IR radiation incident on those photodetectors, and may be subtracted from, or otherwise linearly combined with, the output signals of the photodetectors 314 to more accurately determine the amount of SWIR radiation incident on the photodetectors 314. Other reasons for operating the imager 900 in a mode in which the output signals of both photodetectors of the pixels 912 are read out and processed are possible.

The capability of the imager 900 to detect both visible and infrared radiation may enable its use in various environments, such as bright light and low-light environments. It may also obviate the need for two separate imagers, or cameras, to achieve this dual-functionality. Other operating characteristics may also be realized from use of one or more of the aspects described herein.

While an imager may comprise an imaging array of pixels 912 that are all the same, an alternative implementation of an imager 900 comprises an imaging array 911 in which the pixels 912 differ in the wavelengths detected. For example, the pixels 912 of the array 911 may differ in the types of photodetectors, the types of filters, or both.

Figure 10:
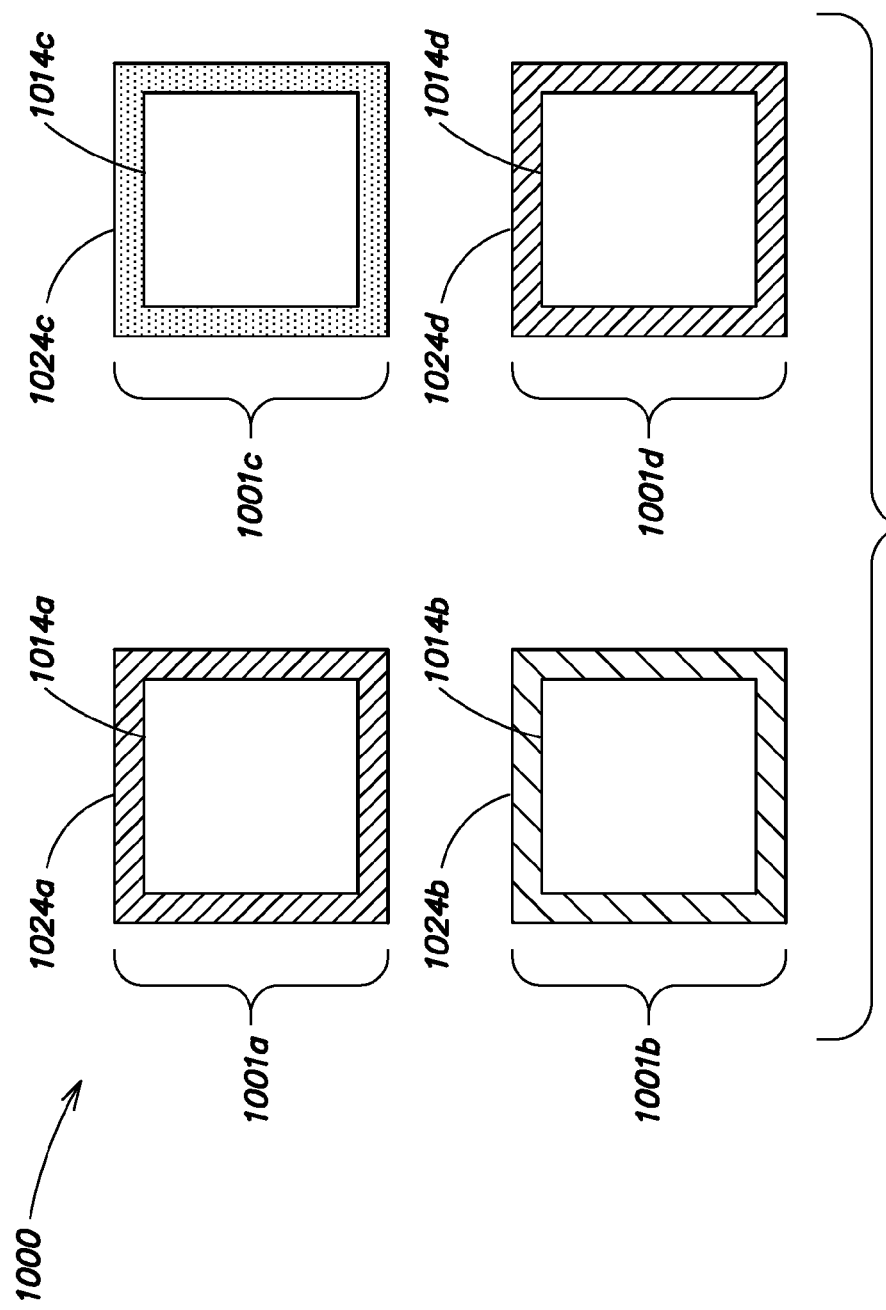
FIG. 10 illustrates an imaging array of pixels having a color filter and a short wavelength infrared (SWIR) filter, according to an embodiment.

FIG. 10 illustrates one non-limiting implementation of how an array, such as array 911, can be separated into repeating pixel groups, with the pixels of the pixel groups differing in the wavelengths of radiation detected. FIG. 10 is a top-down view of a pixel group 1000 having four pixels 1001a, 1001b, 1001c, and 1001d. Each pixel comprises two photodetectors: one photodetector to detect SWIR radiation and a second photodetector to detect visible radiation. For example, the photodetectors 1014a-1014d can all be germanium photodetectors (or any other photodetector) capable of detecting SWIR radiation and the photodetectors 1024a-1024d can all be silicon photodetectors (or other photodetectors) for detecting visible radiation. The color of visible radiation detected by the photodetectors 1024a-1024d can be controlled in any suitable way (e.g., with the use of filters on the pixels), such that the different pixels detect different colors. For example, photodetectors 1024a and 1024d may detect green light (e.g., pixels 1001a and 1001d may comprise green filters), while photodetector 1024b may detect blue light, and photodetector 1024c may detect red light. This pattern of color pixels is referred to as a Bayer pattern. This is just an example, as other arrangements are possible. Moreover, the colors selected are not limited to red, green, and blue, but can be any colors, such as cyan, yellow, and magenta, or any other colors.

Each pixel may detect the full SWIR range. Alternatively, one or more of the pixels can include a SWIR filter to restrict the wavelengths in the SWIR spectrum that photodetectors 1014a-1014d receive. Thus, different pixels of the imager may detect different bands, or ranges, or wavelengths of SWIR radiation. When different pixels detect different bands of SWIR radiation, the pixels may be arranged in any suitable configuration. For example, the pixels may be arranged in a checkerboard pattern, or any other suitable configuration.

Thus, it will be appreciated that an imaging array may comprise any number of subsets of pixels arranged in any suitable pattern. The various subsets of pixels may detect differing colors within the visible spectrum, differing wavelength bands within the SWIR spectrum, or may differ in any other way with respect to their detection capabilities. The aspect of the invention relating to an imager comprising pixels having multiple types of photodetectors to detect different ranges of wavelengths of incident radiation is not limited to any particular types or arrangements of pixels.

Having thus described several aspects of the invention, it is to be appreciated various alterations, modifications, and improvements will readily occur to those skilled in the art. Such alterations, modification, and improvements are intended to be within the spirit and scope of the aspects of the invention. Accordingly, the foregoing description and drawings are by way of example only.

What is claimed is:

1. An apparatus comprising:
a plurality of pixels configured to detect radiation incident thereon, the plurality of pixels comprising a first pixel comprising:
a first photodetector comprising germanium and configured to produce a first photoresponse indicative of a quantity of radiation incident thereon;
a second photodetector comprising silicon and configured to produce a second photoresponse indicative of a quantity of radiation incident thereon; and
readout circuitry configured to read out the first photoresponse and the second photoresponse,
wherein the second photodetector is configured to receive radiation that bypasses the first photodetector, and
wherein the second photodetector, when viewed from an imaging side of the first pixel, is shaped approximately as a closed contour encompassing the first photodetector.

2. The apparatus of claim 1, further comprising a substrate and a dielectric layer formed on the substrate, wherein the first photodetector is formed in the dielectric layer and the second photodetector is formed in the substrate.

3. The apparatus of claim 2, wherein the substrate is silicon.

4. The apparatus of claim 1, wherein the first photodetector is configured to detect short wavelength infrared radiation incident on the first pixel and wherein the second photodetector is configured to detect visible radiation incident on the first pixel.

5. The apparatus of claim 1, wherein the first pixel further comprises a filter configured to block at least some radiation incident on the first pixel from reaching the first photodetector and/or the second photodetector.

6. The apparatus of claim 5, wherein the filter functions to pass at least some short wavelength infrared radiation and radiation from the visible spectrum corresponding to only a single color selected from red, green, blue, yellow, cyan, and magenta.

7. The apparatus of claim 5, wherein the filter functions to absorb a first range of wavelengths in a short wavelength infrared (SWIR) spectrum and to pass a second range of wavelengths in the SWIR spectrum.

8. The apparatus of claim 1, wherein the readout circuitry is configured to read out the first photoresponse and the second photoresponse as a single signal.

9. The apparatus of claim 8, wherein the plurality of pixels are formed on a chip, and wherein the readout circuitry is configured to form a linear combination of the first photoresponse and the second photoresponse on the chip.

10. The apparatus of claim 8, wherein the plurality of pixels are formed on a chip, and wherein the readout circuitry is configured to provide the first photoresponse and the second response off the chip, and is further configured to form a linear combination of the first photoresponse and the second photoresponse off the chip.

11. The apparatus of claim 1, wherein the plurality of pixels comprises a first subset of pixels comprising the first pixel, a second subset of pixels, and a third subset of pixels, and wherein the first subset of pixels, the second subset of pixels, and the third subset of pixels are arranged in repeating pixel groups.

12. The apparatus of claim 11, wherein each pixel of the first subset of pixels comprises at least one photodetector configured to detect a first visible color of radiation incident thereon, each pixel of the second subset of pixels comprises at least one photodetector configured to detect a second visible color of radiation incident thereon, and each pixel of the third subset of pixels comprises at least one photodetector configured to detect a third visible color of radiation incident thereon.

13. The apparatus of claim 12, wherein each pixel of the plurality of pixels comprises at least one photodetector configured to detect short wavelength infrared radiation.

14. The apparatus of claim 1, wherein the second photodetector comprises a larger surface area than the first photodetector.

15. An apparatus comprising:
a silicon substrate;
a plurality of pixels formed on the silicon substrate and configured to detect radiation incident thereon, the plurality of pixels comprising a first pixel, the first pixel comprising
a first photodetector formed of silicon; and
a second photodetector formed of a semiconductor material other than silicon; and
readout circuitry configured to read out a first photoresponse of the first photodetector and a second photoresponse of the second photodetector,
wherein the second photodetector is configured to receive radiation that bypasses the first photodetector, and
wherein the second photodetector, when viewed from an imaging side of the first pixel, is shaped approximately as a closed contour encompassing the first photodetector.

16. The apparatus of claim 15, wherein the semiconductor material other than silicon of which the second photodetector is formed comprises germanium.

17. The apparatus of claim 16, wherein the semiconductor material other than silicon of which the second photodetector is formed comprises substantially pure germanium.

18. The apparatus of claim 15, wherein the first photodetector is formed in the silicon substrate.

* * * * *